United States Patent
Kuroda et al.

(10) Patent No.: US 11,839,077 B2
(45) Date of Patent: Dec. 5, 2023

(54) SEMICONDUCTOR STORAGE DEVICE

(71) Applicant: Kioxia Corporation, Tokyo (JP)

(72) Inventors: Toshifumi Kuroda, Yokkaichi Mie (JP); Yusuke Shimada, Yokkaichi Mie (JP); Satoshi Nagashima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 317 days.

(21) Appl. No.: 17/190,865

(22) Filed: Mar. 3, 2021

(65) Prior Publication Data

US 2022/0077174 A1    Mar. 10, 2022

(30) Foreign Application Priority Data

Sep. 4, 2020    (JP) ................. 2020-149398

(51) Int. Cl.
*H10B 43/20* (2023.01)
*H10B 41/10* (2023.01)
*H10B 41/20* (2023.01)
*H10B 41/35* (2023.01)
*H10B 43/10* (2023.01)
(Continued)

(52) U.S. Cl.
CPC ............ *H10B 43/20* (2023.02); *H10B 41/10* (2023.02); *H10B 41/20* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 43/10; H10B 43/20; H10B 43/35; H10B 41/10; H10B 41/20; H10B 41/35; H10B 43/27; H01L 29/518; H01L 29/4234; H01L 29/7926; H01L 29/42324; G11C 11/5671; G11C 11/5692; G11C 11/5621;
(Continued)

(56) References Cited

U.S. PATENT DOCUMENTS 10,559,588 B2 *   2/2020   Dong .................. H10B 43/35
11,282,853 B2 *   3/2022   Sotome ............... H01L 23/481
(Continued)

FOREIGN PATENT DOCUMENTS

JP    2010-016067 A    1/2010
JP    2018-026518 A    2/2018
(Continued)

*Primary Examiner* — Alia Sabur
*Assistant Examiner* — David Gonzalez Alcantara
(74) *Attorney, Agent, or Firm* — Foley & Lardner LLP

(57) ABSTRACT

A semiconductor storage device includes: a first conductive layer and a second conductive layer arranged in a first direction; a plurality of first semiconductor layers facing the first conductive layer, the plurality of first semiconductor layers arranged in a second direction intersecting the first direction; a first charge storage layer disposed between the plurality of first semiconductor layers and the first conductive layer; and a first insulating layer provided between the plurality of first semiconductor layers and the first charge storage layer in the first direction. The first insulating layer includes a first region, a second region, and a third region provided between the first region and the second region in the second direction. A nitrogen concentration in the first region and the second region is lower than a nitrogen concentration in the third region.

15 Claims, 21 Drawing Sheets

(51) Int. Cl.
*H10B 43/35* (2023.01)
*H10B 43/27* (2023.01)

(58) Field of Classification Search
CPC ... G11C 16/0475; G11C 16/0408; G11C 7/02; G11C 2213/75
See application file for complete search history.

(56) References Cited

U.S. PATENT DOCUMENTS

| | | |
|---|---|---|
| 2008/0179658 A1 | 7/2008 | Rao et al. |
| 2012/0001249 A1* | 1/2012 | Alsmeier ............... H10B 41/00 438/266 |
| 2013/0240976 A1 | 9/2013 | Tanaka |
| 2015/0325282 A1 | 11/2015 | Kato et al. |
| 2016/0148947 A1* | 5/2016 | Seo ........................ H10B 43/10 257/324 |
| 2019/0043878 A1 | 2/2019 | Pan et al. |
| 2019/0164742 A1 | 5/2019 | Noguchi et al. |
| 2019/0172839 A1 | 6/2019 | Tokuda |
| 2019/0280122 A1 | 9/2019 | Carlson et al. |
| 2020/0091178 A1* | 3/2020 | Nakao .................... H10B 41/30 |

FOREIGN PATENT DOCUMENTS

| | | |
|---|---|---|
| TW | 200847298 A | 12/2008 |
| TW | 201405717 A | 2/2014 |
| TW | 201606766 A | 2/2016 |
| TW | 201724527 A | 7/2017 |

* cited by examiner

SEMICONDUCTOR STORAGE DEVICE

CROSS-REFERENCE TO RELATED APPLICATION(S)

This application is based upon and claims the benefit of priority from. Japanese Patent Application No. 2020-149398, filed Sep. 4, 2020, the entire contents of which are incorporated herein by reference.

FIELD

Embodiments described herein relate generally to a semiconductor storage device.

BACKGROUND

A semiconductor storage device is known which includes a substrate, multiple conductive layers stacked in a direction intersecting the surface of the substrate, a semiconductor layer that extends in the stacking direction of the multiple conductive layers and faces the multiple conductive layers, and a gate insulating film provided between the conductive layers and the semiconductor layer. The gate insulating film includes, for example, a memory unit capable of storing data, such as a silicon nitride film (SiN), a floating gate or the like.

DETAILED DESCRIPTION

Figure 1:
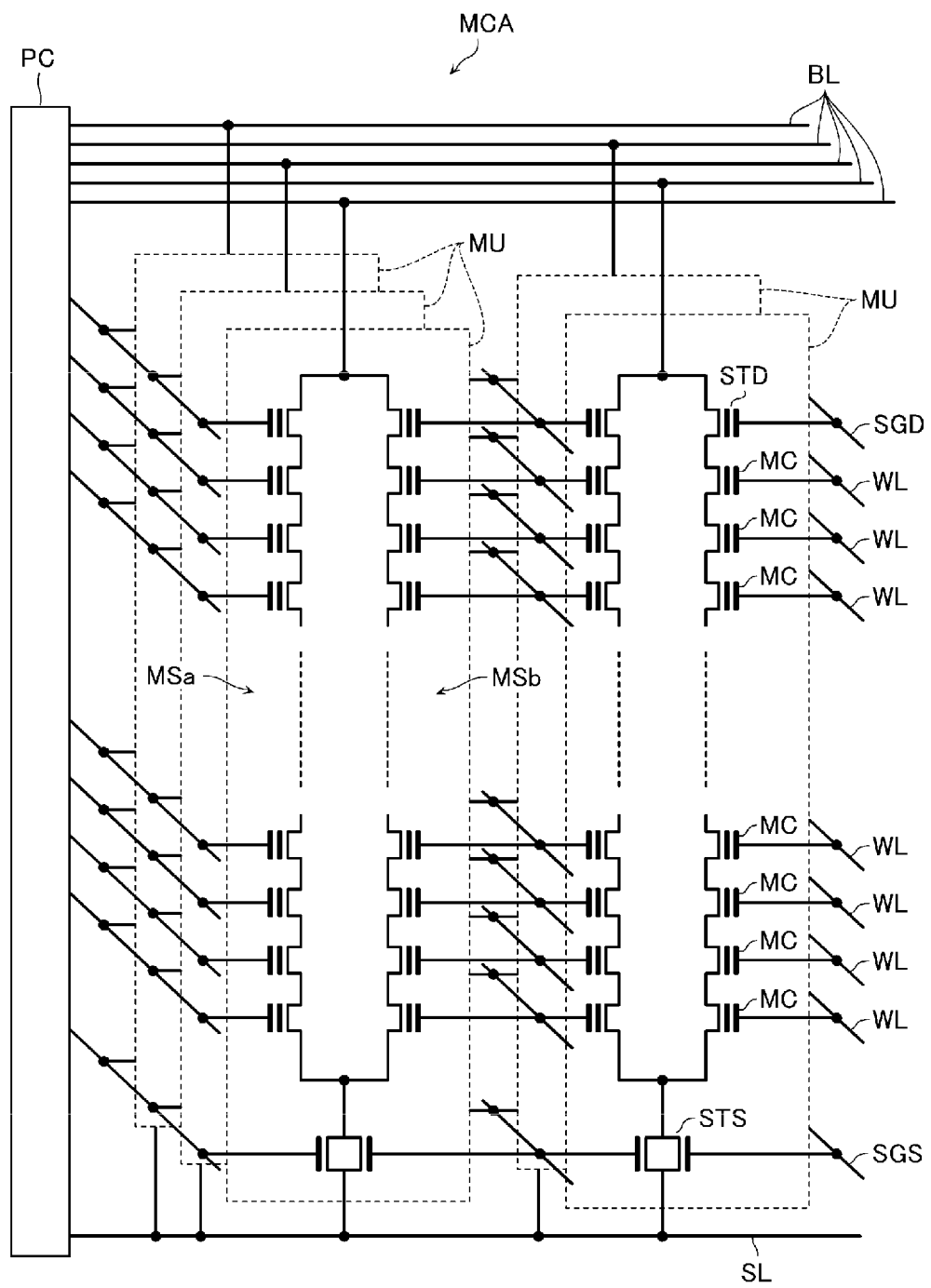
FIG. 1 is a schematic equivalent circuit diagram of a semiconductor storage device according to a first embodiment.

At least one embodiment provides a semiconductor storage device which operates suitably.

In general, according to at least one embodiment, a semiconductor storage device includes: a first conductive layer and a second conductive layer that are arranged in a first direction; a plurality of first semiconductor layers facing the first conductive layer between the first conductive layer and the second conductive layer, the plurality of first semiconductor layers being arranged in a second direction that intersects the first direction; a first charge storage layer that is provided between the plurality of first semiconductor layers and the first conductive layer in the first direction, and extends in the second direction over a plurality of regions between the plurality of first semiconductor layers and the first conductive layer; and a first insulating layer provided between the plurality of first semiconductor layers and the first charge storage layer in the first direction. The first insulating layer includes a first region that faces one end of each of the first semiconductor layers in the second direction, in the first direction, a second region that faces the other end of each of the first semiconductor layers in the second direction, in the first direction, and a third region provided between the first region and the second region in the second direction. A nitrogen concentration in the first region and the second region is lower than a nitrogen concentration in the third region.

Next, a semiconductor storage device according to the embodiments will be described in detail with reference to the accompanying drawings. Meanwhile, the embodiments are merely examples, and are not intended to limit the scope of the present disclosure.

In addition, each drawing is schematic, and may omit some components or the like. Further, in the embodiments, similar portions will be denoted by the same reference numerals, and descriptions thereof may be omitted.

Further, in the descriptions herein, a predetermined direction parallel to the surface of a substrate will be referred to as an X direction, a direction parallel to the surface of the substrate and perpendicular to the X direction will be referred to as a Y direction, and a direction perpendicular to the upper surface of the substrate will be referred to as a Z direction.

Further, in the descriptions herein, a direction along a predetermined plane will be referred to as a first direction, a direction intersecting the first direction along the predetermined plane will be referred to as a second direction, and a direction intersecting the predetermined plane will be referred to as a third direction. The first, second, and third directions may or may not correspond to the X, Y, and Z directions.

Further, in the descriptions herein, the criterion for expressions such as "upper" and "lower" is based on the substrate. For example, the direction away from the substrate along the first direction will be referred to as an upward direction, and the direction that approaches the substrate along the first direction will be referred to as a downward direction. Further, the lower surface or end of a certain element indicates the surface or end of the element close to the substrate, and the upper surface or end of the element indicates the surface or end of the element opposite to the surface or end thereof close to the substrate. Further, the surface of the element that intersects the second or third direction will be referred to as a side surface or the like of the element.

Further, in the descriptions herein, the "width" or "thickness" of an element, a member or the like in a predetermined direction may indicate the width or thickness of the cross section of the element that is observed by, for example, a SEM (scanning electron microscopy) or a TEM (transmission electron microscopy).

First Embodiment

[Configuration]

FIG. 1 is a schematic equivalent circuit diagram of a semiconductor storage device according to a first embodiment.

The semiconductor storage device according to at least one embodiment includes a memory cell array MCA and a peripheral circuit PC that controls the memory cell array MCA.

The memory cell array MCA includes multiple memory units MU. Each of the multiple memory units MU includes two memory strings MSa and MSb that are electrically independent from each other. One end of each of the memory strings MSa and MSb is connected to a drain-side select transistor STD, and is connected to a common bit line BL via the drain-side select transistor STD. The other end of each of the memory strings MSa and MSb is connected to a source-side select transistor STS, and is connected to a common source line SL via the source-side select transistor STS.

Each of the memory strings MSa and MSb includes multiple memory cells MC that are connected to each other in series. The memory cells MC are field-effect type transistors each including a semiconductor layer, a gate insulating film, and a gate electrode. The semiconductor layer functions as a channel region. The gate insulating film includes a charge storage layer capable of storing data. A threshold voltage of each memory cell MC varies according to a charge amount in the charge storage layer. The gate electrode is a portion of word lines WL.

The select transistors STD and STS are field-effect type transistors that each include a semiconductor layer, a gate insulating film, and a gate electrode. The semiconductor layer functions as a channel region. The gate electrode of the drain-side select transistor STD is a portion of a drain-side select gate line SGD. The gate electrode of the source-side select transistor STS is a portion of a source-side select gate line SGS.

The peripheral circuit PC generates, for example, voltages required for a read operation, a write operation, and an erase operation, and applies the generated voltages to the bit lines BL, the source line SL, the word lines WL, and the select gate lines SGD and SGS. The peripheral circuit PC includes circuits such as, for example, a row decoder, a sense amplifier module, a voltage generation circuit, a sequencer, and various registers. The peripheral circuit PC is implemented by, for example, multiple transistors and wires provided on a semiconductor substrate.

Figure 2:
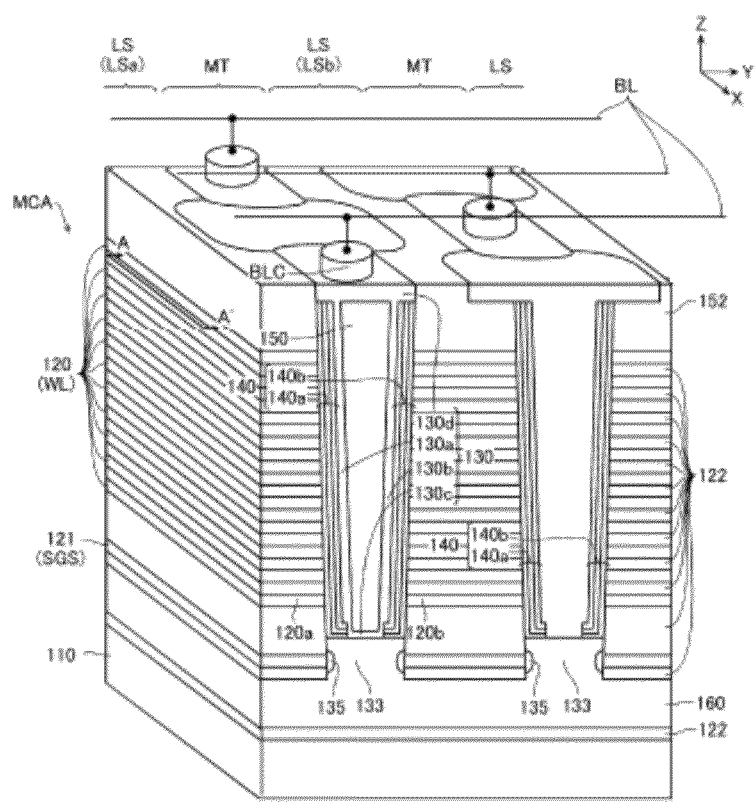
FIG. 2 is a schematic perspective view of the same semiconductor storage device.
Figure 3A:
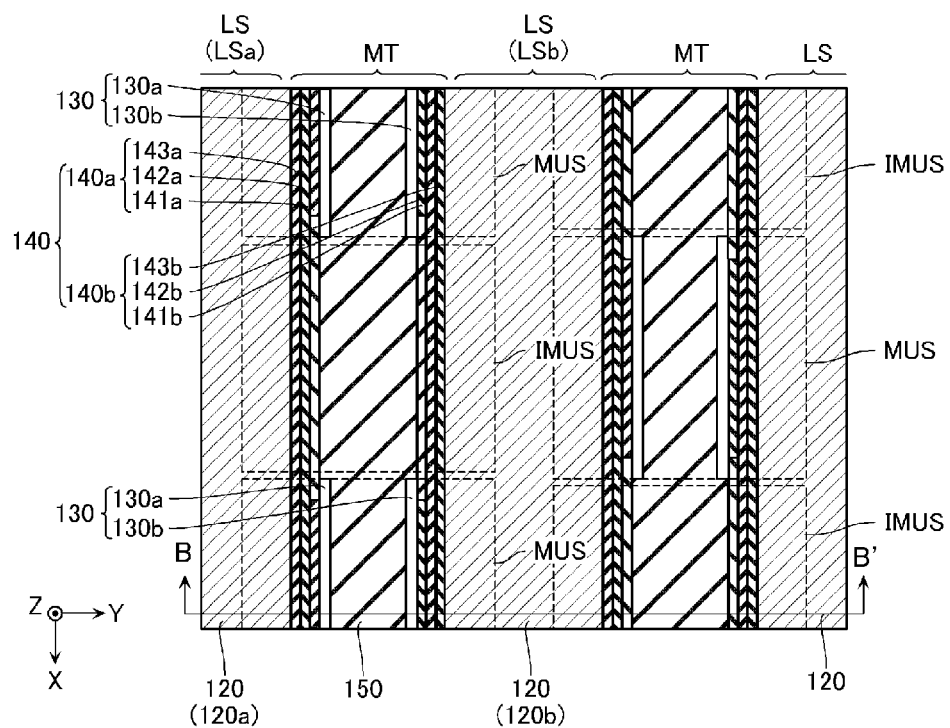
FIG. 3A is a schematic plan view that corresponds to the cross section taken along line A-A' in FIG. 2.
Figure 3B:
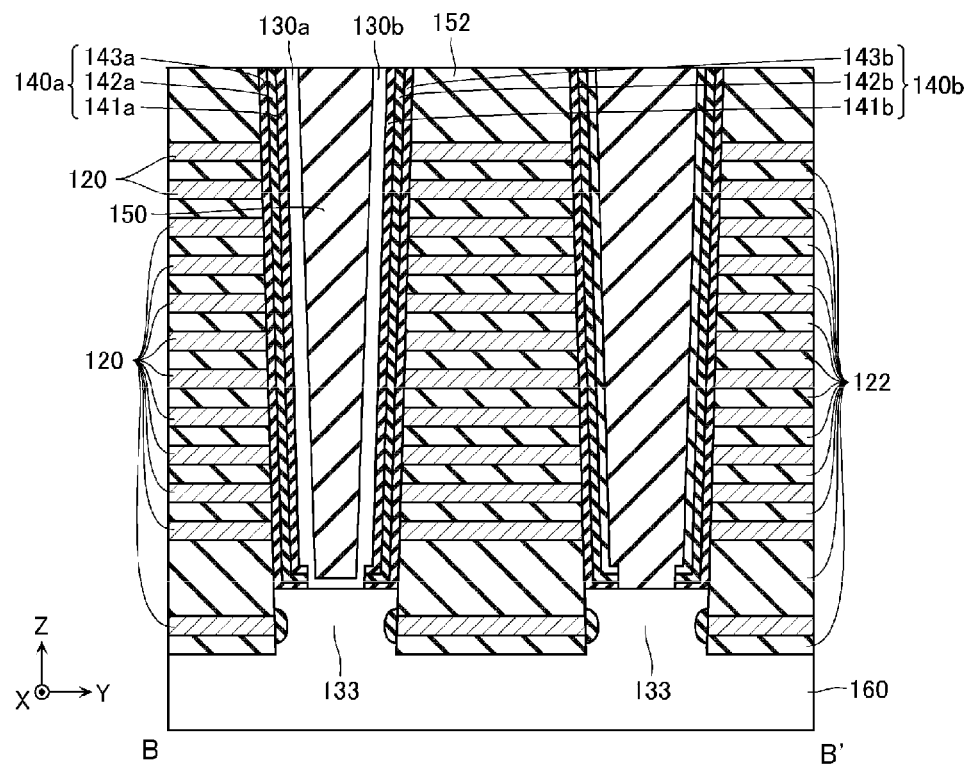
FIG. 3B is a schematic cross-sectional view that corresponds to the cross section taken along line B-B' in FIG. 3A.

Next, an example of a schematic configuration of the semiconductor storage device according to at least one embodiment will be described with reference to FIGS. 2, 3A, and 3B. FIG. 2 is a schematic perspective view of the same semiconductor storage device. FIG. 3A is a schematic plan view that corresponds to the cross section taken along line A-A' in FIG. 2. FIG. 3B is a schematic cross-sectional view that corresponds to the cross section taken along line B-B' in FIG. 3A. FIGS. 2, 3A, and 3B omit some components for the sake of clarity.

For example, as illustrated in FIG. 2, the semiconductor storage device according to at least one embodiment includes a substrate 110 and a memory cell array MCA provided above the substrate 110.

The substrate 110 is, for example, a semiconductor substrate such as single crystal silicon (Si) or the like. The substrate 110 has, for example, a double-well structure in which an n-type impurity layer is formed on the upper surface of the semiconductor substrate, and a p-type impurity layer is formed in the n-type impurity layer. Meanwhile, for example, transistors, wires or the like that make up the peripheral circuit PC may be provided on the surface of the substrate 110.

The memory cell array MCA includes multiple layered body structures LS arranged in the Y direction. Each layered body structure LS includes multiple conductive layers 120 stacked in the Z direction. A memory trench structure MT is provided between layered body structures LS. The layered body structures LS and the memory trench structures MT are arranged alternately in the Y direction. For example, as illustrated in FIG. 3A, the memory trench structure MT includes multiple memory unit structures MUS and inter-memory-unit structures IMUS that are arranged in the X direction. Each memory unit structure MUS includes a semiconductor layer 130, a portion of a gate insulating layer 140, and a portion of an insulating layer 150. Each inter-memory-unit structure IMUS includes a portion of the gate insulating layer 140 and a portion of the insulating layer 150. Further, for example, as illustrated in FIG. 2, the lower end of the semiconductor layer 130 is connected to a wiring layer 160.

Each conductive layer 120 is a substantially plate-shaped conductive layer that extends in the X direction, and is, for example, a stacked film of titanium nitride (TiN) and tungsten (W), or a conductive layer such as polycrystalline silicon (p-Si) or the like into which impurities are injected. The conductive layers 120 function as the word lines WL and the gate electrodes of the memory cells MC (FIG. 1), respectively.

Conductive layers 121 (FIG. 2) are provided below the multiple conductive layers 120, and are made of the same material as that of, for example, the conductive layers 120. The conductive layers 121 function as the gate electrodes of the source-side select gate line SGS and the source-side select transistor STS (FIG. 1).

Insulating layers 122 such as silicon oxide (SiO$_2$) or the like are provided among the multiple conductive layers 120, between the lowermost conductive layer 120 and the conductive layer 121, and between the conductive layer 121 and the wiring layer 160.

In the descriptions hereinafter, one of the two layered body structures LS arranged side by side in the Y direction may be referred to as a layered body structure LSa, and the other may be referred to as a layered body structure LSb. Further, the conductive layers 120 in the layered body structure LSa may be referred to as first conductive layers 120*a*, and the conductive layers 120 in the layered body structure LSb may be referred to as second conductive layers 120*b*.

For example, as illustrated in FIG. 3A, the semiconductor layer 130 is provided in the X direction corresponding to the multiple memory unit structures MUS arranged in the X direction. The semiconductor layer 130 may be, for example, a semiconductor layer such as undoped polycrystalline silicon (poly-Si) or the like. For example, as illustrated in FIG. 2, the semiconductor layer 130 includes a first semiconductor layer 130*a* provided between the layered body structure LSa and the insulating layer 150, a second semiconductor layer 130*b* provided between the layered body structure LSb and the insulating layer 150, a third semiconductor layer 130*c* provided at the lower ends of the first semiconductor layer 130*a* and the second semiconductor layer 130*b*, and a fourth semiconductor layer 130*d* provided at the upper ends of the first semiconductor layer 130*a* and the second semiconductor layer 130*b*.

Multiple first semiconductor layers 130*a* are provided side by side in the X direction, and each extend in the Z direction to face the multiple first conductive layers 120*a*. The first semiconductor layers 130*a* functions as channel regions of the multiple memory cells MC in the memory string MSa (FIG. 1).

Multiple second semiconductor layers 130*b* are provided side by side in the X direction, and each extend in the Z direction to face the multiple second conductive layers 120*b*. The second semiconductor layers 130*b* function as channel regions of the multiple memory cells MC in the memory string MSb (FIG. 1).

For example, as illustrated in FIG. 2, the fourth semiconductor layer 130*d* is connected to the first semiconductor layer 130*a* and the second semiconductor layer 130*b*. The fourth semiconductor layer 130*d* is connected to a bit line contact BLC such as tungsten (W) or the like and a bit line BL such as cupper (Cu) or the like.

Further, for example, as illustrated in FIG. 2, a semiconductor layer 133 is provided below the semiconductor layer 130. The semiconductor layer 133 is connected to the third semiconductor layer 130*c*. The semiconductor layer 133 is provided between the two conductive layers 121 adjacent to each other in the Y direction, and faces the two conductive layers 121. The semiconductor layer 133 is a semiconductor layer such as polycrystalline silicon (p-Si) or the like, and functions as a channel region of the source-side select transistor STS (FIG. 1). An insulating layer 135 such as silicon oxide (SiO$_2$) or the like is provided between the semiconductor layer 133 and the conductive layer 121.

The gate insulating layer 140 includes a first gate insulating layer 140*a* and a second gate insulating layer 140*b*.

The first gate insulating layer 140*a* is provided on one side surface of the layered body structure LS in the Y direction between the multiple first semiconductor layer 130*a* and the multiple first conductive layers 120*a* arranged in the Z direction, and extends in the Z direction. Further, the first gate insulating layer 140*a* extends in the X direction over multiple regions between the multiple first semiconductor layers 130*a* and the first conductive layer 120*a*. For example, as illustrated in FIG. 3A, the first gate insulating layer 140*a* includes a first insulating layer 141*a*, a first charge storage layer 142*a*, and a first block insulating layer 143*a*.

The second gate insulating layer 140*b* is provided on the other side surface of the layered body structure LS in the Y direction between the second semiconductor layer 130*b* and the multiple second conductive layers 120*b* arranged in the Z direction, and extends in the Z direction. Further, the second gate insulating layer 140*b* extends in the X direction over multiple regions between the multiple second semiconductor layers 130*b* and the second conductive layer 120*b*. For example, as illustrated in FIG. 3A, the second gate insulating layer 140*b* includes a second insulating layer 141*b*, a second charge storage layer 142*b*, and a second block insulating layer 143*b*.

The first insulating layer 141*a* and the second insulating layer 141*b* include, for example, insulating layers such as silicon oxynitride (SiON) or the like. The first charge storage layer 142*a* and the second charge storage layer 142*b* include, for example, insulating layers such as silicon nitride (SiN) or the like. The first block insulating layer 143*a* and the second block insulating layer 143*b* include, for example, insulating layers such as silicon oxide (SiO$_2$) or the like.

Figure 4:
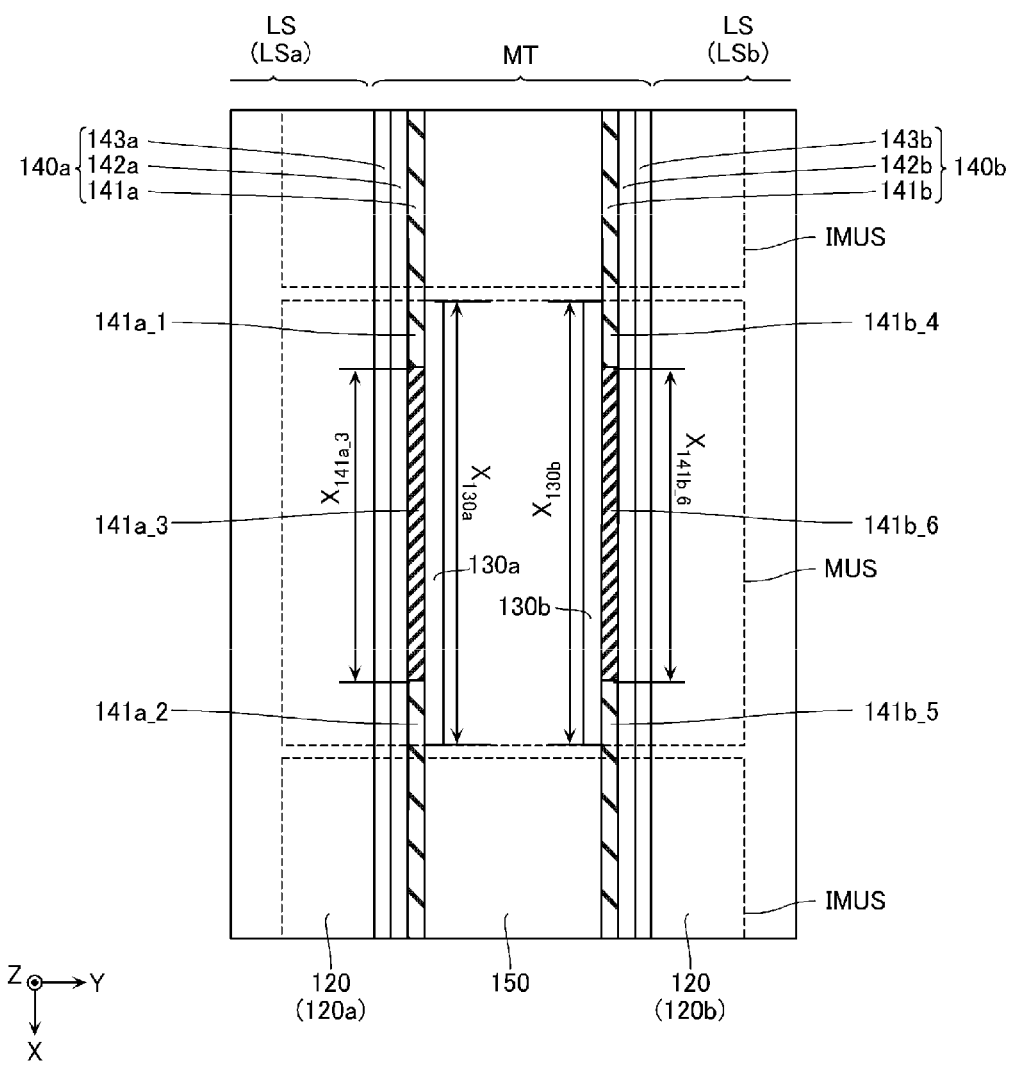
FIG. 4 is a schematic enlarged view of a memory unit structure and its nearby portions in FIG. 3A.

Here, the first insulating layer 141*a* and the second insulating layer 141*b* will be described in detail with reference to FIG. 4. FIG. 4 is a schematic enlarged view of the memory unit structure MUS and portions that correspond to the vicinity thereof in FIG. 3A.

The first insulating layer 141*a* includes multiple high nitrogen concentration regions provided corresponding to the multiple memory unit structures MUS arranged in the X direction, and multiple low nitrogen concentration regions provided corresponding to the multiple inter-memory-unit structures IMUS arranged in the X direction. For example, FIG. 4 illustrates a first region 141*a*_1 and a second region 141*a*_2 as two low nitrogen concentration regions that correspond to two inter-memory-unit structures IMUS adjacent to each other in the X direction. Further, FIG. 4 illustrates a third region 141*a*_3 as a high nitrogen concentration region provided between the two low nitrogen concentration regions. The width X141*a*_3 of each high nitrogen concentration region in the X direction is smaller than the width X130*a* of the first semiconductor layer 130*a* in the X direction. Further, the ends of each low nitrogen concentration region in the X direction face the Y-directional side surfaces of the two first semiconductor layers 130*a* adjacent to each other in the X direction. For example, in the memory unit structure MUS illustrated in FIG. 4, the end of the first region 141*a*_1 in the X direction is in contact with the Y-directional side surface of one end of the first semiconductor layer 130*a* in the X direction. Further, the position of the second region 141*a*_2 in the X direction is in contact with the Y-directional side surface of the other end of the first semiconductor layer 130*a* in the X direction. The nitrogen concentration in each low nitrogen concentration region (e.g., the first region 141*a*_1 and the second region

141*a*_2) is lower than the nitrogen concentration in each high nitrogen concentration region (e.g., the third region 141*a*_3).

The low nitrogen concentration region (e.g., the first region 141*a*_1 and the second region 141*a*_2) may contain silicon oxynitride (SiON) having a lower nitrogen content than that of the high nitrogen concentration region (e.g., the third region 141*a*_3). Further, the low nitrogen concentration region (e.g., the first region 141*a*_1 and the second region 141*a*_2) may contain silicon oxide ($SiO_2$).

The second insulating layer 141*b* includes multiple high nitrogen concentration regions provided corresponding to the multiple memory unit structures MUS arranged in the X direction, and multiple low nitrogen concentration regions provided corresponding to the multiple inter-memory-unit structures IMUS arranged in the X direction. For example, FIG. 4 illustrates a fourth region 141*b*_4 and a fifth region 141*b*_5 as two low nitrogen concentration regions that correspond to two inter-memory-unit structures IMUS adjacent to each other in the X direction. Further, FIG. 4 illustrates a sixth region 141*b*_6 as a high nitrogen concentration region provided between the two low nitrogen concentration regions. The width X141*b*_6 of each high nitrogen concentration region in the X direction is smaller than the width X130*b* of the second semiconductor layer 130*b* in the X direction. Further, the ends of each low nitrogen concentration region in the X direction face the Y-directional side surfaces of the two second semiconductor layers 130*b* to each other in the X direction. For example, in the memory unit structure MUS illustrated in FIG. 4, the end of the fourth region 141*b*_4 in the X direction is in contact with the Y-directional side surface of one end of the second semiconductor layer 130*b* in the X direction. Further, the position of the fifth region 141*b*_5 in the X direction is in contact with the Y-directional side surface of the other end of the second semiconductor layer 130*b* in the X direction. The nitrogen concentration in the low nitrogen concentration region (e.g., the fourth region 141*b*_4 and the fifth region 141*b*_5) is lower than the nitrogen concentration in the high nitrogen concentration region (e.g., the sixth region 141*b*_6).

The low nitrogen concentration region (e.g., the fourth region 141*b*_4 and the fifth region 141*b*_5) may contain silicon oxynitride (SiON) having a lower nitrogen content than that of the high nitrogen concentration region (e.g., the sixth region 141*b*_6). Further, the low nitrogen concentration region (e.g., the fourth region 141*b*_4 and the fifth region 141*b*_5) may contain silicon oxide ($SiO_2$).

Meanwhile, the positions, ranges, and nitrogen concentrations of the high nitrogen concentration region and the low nitrogen concentration region may be measured by analyzing the compositions of the regions using an EDS (energy dispersive X-ray spectroscopy) method or the like.

The insulating layer 150 is provided at the center of the memory trench structure MT in the Y direction, and extends in the X direction and the Z direction. For example, as illustrated in FIG. 3B, the Y-directional width of the portion of the insulating layer 150 that is in the memory unit structure MUS is smaller than the Y-directional width of the portion of the insulating layer 150 that is in the inter-memory-unit structure IMUS. The insulating layer 150 is, for example, an insulating layer such as silicon oxide ($SiO_2$) or the like.

The wiring layer 160 (FIG. 2) may be a plate-shaped conductive layer that extends in the X direction and the Y direction. The wiring layer 160 is, for example, a conductive layer such as polycrystalline silicon (poly-Si) or the like into which impurities are injected, and functions as the source line SL (FIG. 1). Meanwhile, the structure of the source line SL may be appropriately changed. For example, the source line SL may be a portion of the surface of the substrate 110. Further, the source line SL may include a metal layer such as titanium nitride (TiN), tungsten (W) or the like. Further, the source line SL may be connected to the lower end of the semiconductor layer 130, or may be connected to the Y-directional side surface of the semiconductor layer 130.

[Manufacturing Method]

Next, a method of manufacturing the semiconductor storage device according to at least one embodiment will be described with reference to FIGS. 5A and 5B throughout 19A and 19B. Among FIGS. 5A and 5B throughout 19A and 19B, FIGS. 5A to 19A are schematic plan views illustrating the same manufacturing method. Among FIGS. 5A and 5B throughout 19A and 19B, FIGS. 5B to 19B are schematic cross-sectional views illustrating the same manufacturing method, and represent cross sections that correspond to line D-D' in FIGS. 5A to 19A.

In the descriptions herein below, the first insulating layer 141*a* and the second insulating layer 141*b* may be referred to as an insulating layer 141. Further, the first charge storage layer 142*a* and the second charge storage layer 142*b* may be referred to as a charge storage layer 142. Further, the first block insulating layer 143*a* and the second block insulating layer 143*b* may be referred to as a block insulating layer 143.

Figure 5A:
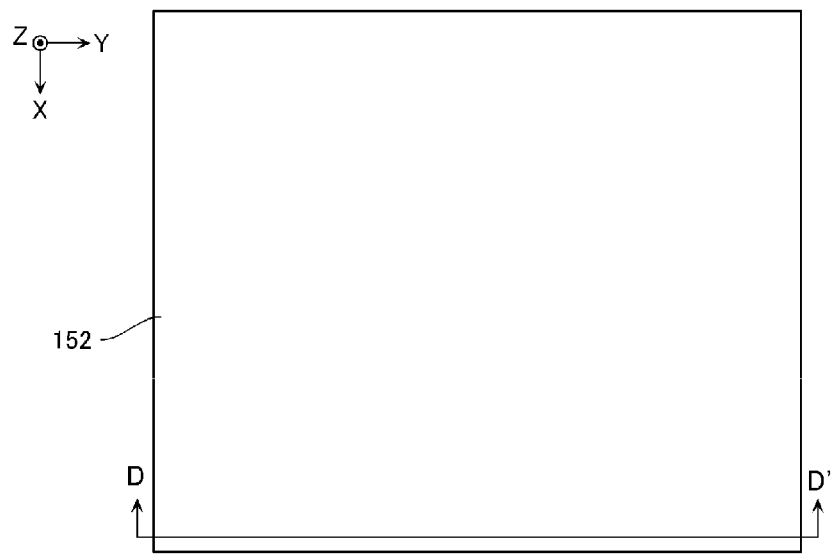
FIGS. 5A and 5B are a schematic plan view and a schematic cross-sectional view illustrating a method of manufacturing the same semiconductor storage device.
Figure 5B:
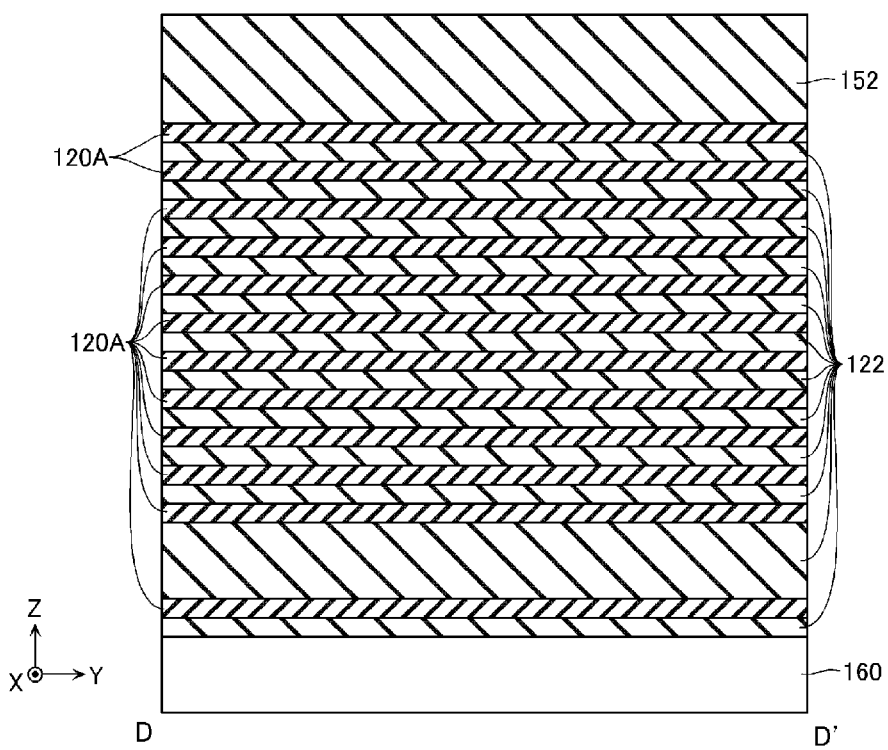

As illustrated in FIGS. 5A and 5B, the wiring layer 160 is formed above the substrate (not illustrated), in the same manufacturing method. Further, the multiple insulating layers 122 and sacrificial layers 120A are alternately stacked on the upper surface of the wiring layer 160. Further, an insulating layer 152 is formed on the upper surface of the uppermost sacrificial layer 120A. Each sacrificial layer 120A is made of, for example, silicon nitride (SiN) or the like. The insulating layer 152 is made of, for example, silicon oxide ($SiO_2$) or the like. The film formation of the wiring layer 160, the insulating layers 122, the sacrificial layers 120A, and the insulating layer 152 is performed by, for example, CVD (chemical vapor deposition) or the like.

Figure 6A:
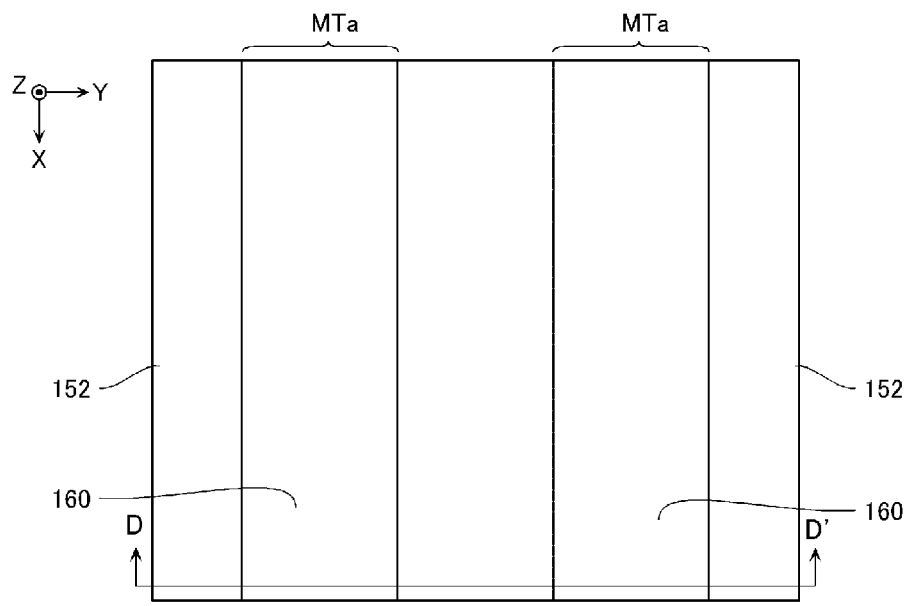
FIGS. 6A and 6B are a schematic plan view and a schematic cross-sectional view illustrating the same manufacturing method.
Figure 6B:
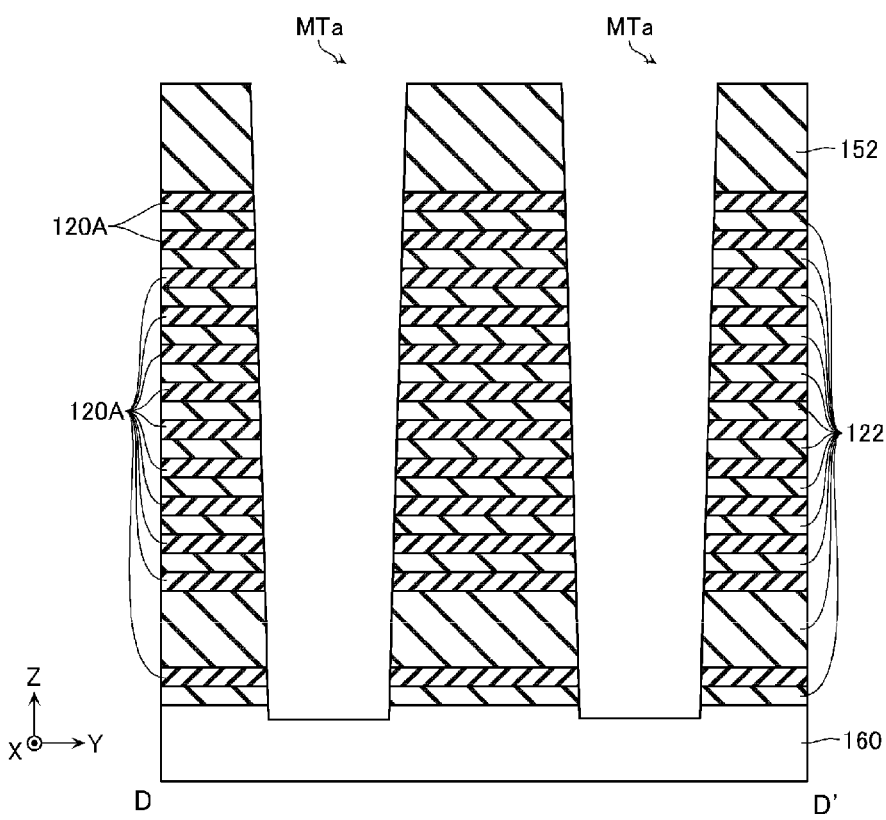

Next, as illustrated in FIGS. 6A and 6B, openings MTa are formed in the insulating layers 122, the sacrificial layers 120A, and the insulating layer 152. For example, each opening MTa is formed by forming an insulating layer having an opening at the portion that corresponds to the opening MTa on the upper surface of the structure illustrated in FIGS. 5A and 5B, and performing RIE (reactive ion etching) or the like using the insulating layer as a mask.

The opening MTa extends in the Z direction, divides the insulating layers 122, the sacrificial layers 120A, and the insulating layer 152 in the Y direction, and exposes the upper surface of the wiring layer 160.

Figure 7A:
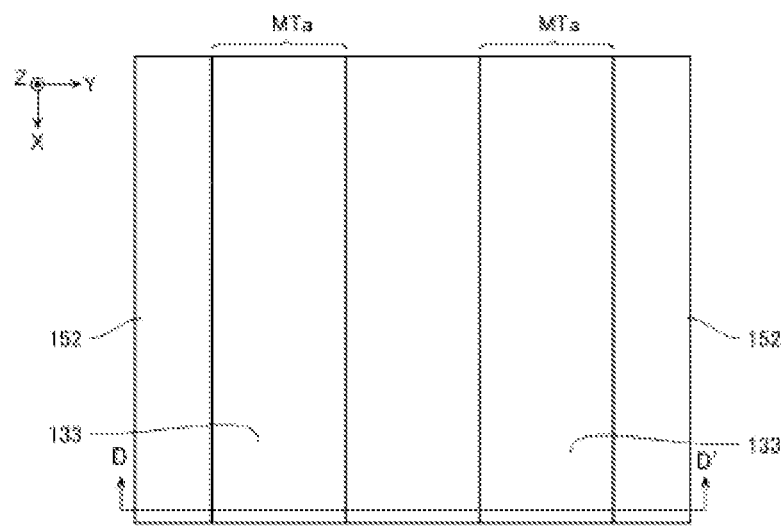
FIGS. 7A and 7B are a schematic plan view and a schematic cross-sectional view illustrating the same manufacturing method.
Figure 7B:
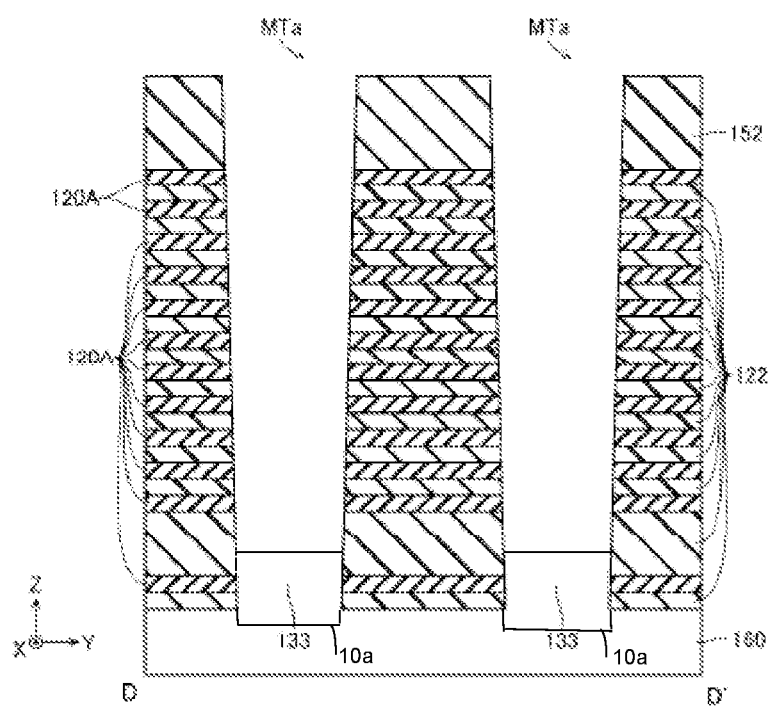

Next, as illustrated in FIGS. 7A and 7B, the semiconductor layer 133 is formed on the bottom surface 10*a* of the opening MTa. The semiconductor layer 133 is formed by, for example, epitaxial growth or the like.

Figure 8A:
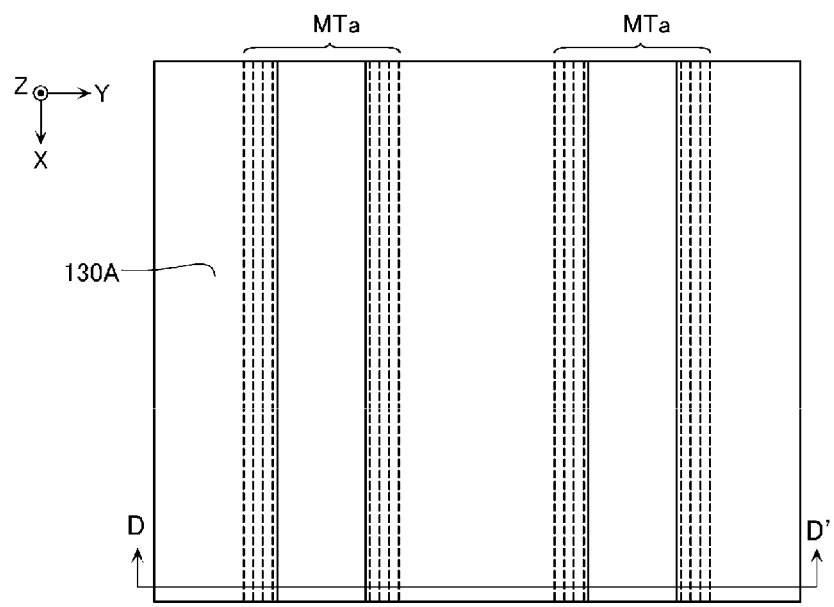
FIGS. 8A and 8B are a schematic plan view and a schematic cross-sectional view illustrating the same manufacturing method.
Figure 8B:
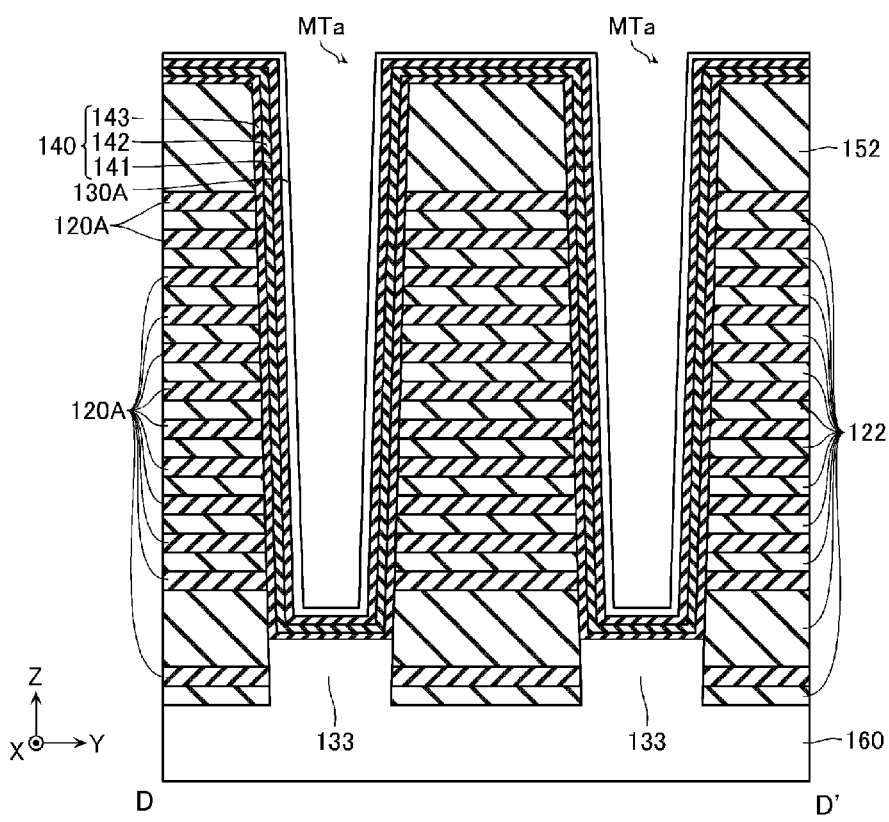

Next, as illustrated in FIGS. 8A and 8B, a block insulating layer 143, a charge storage layer 142, an insulating layer 141, and an amorphous silicon film 130A are formed on the upper surface of the insulating layer 152 and the bottom surface and the side surfaces of the opening MTa. This step is performed by, for example, a method such as CVD or the like.

Figure 9A:
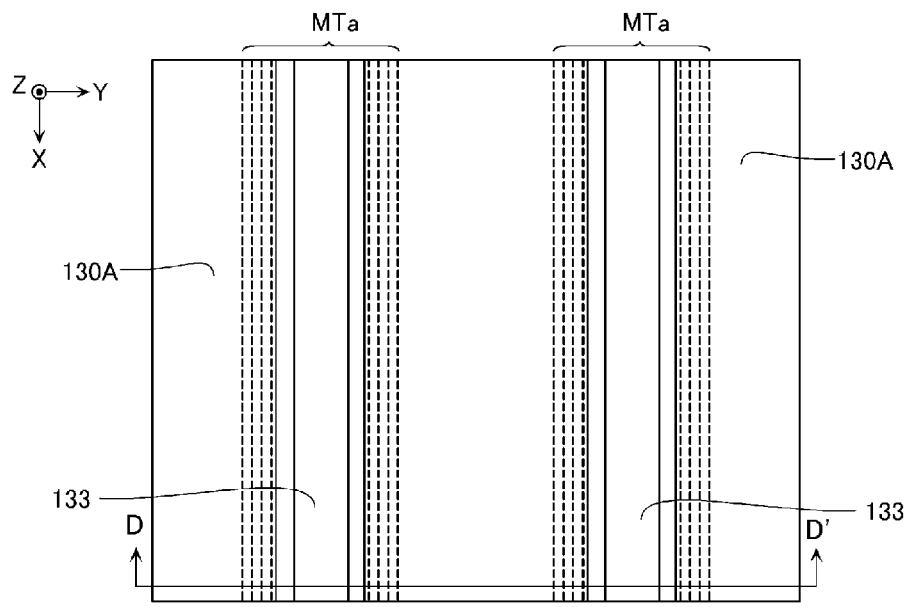
FIGS. 9A and 9B are a schematic plan view and a schematic cross-sectional view illustrating the same manufacturing method.
Figure 9B:
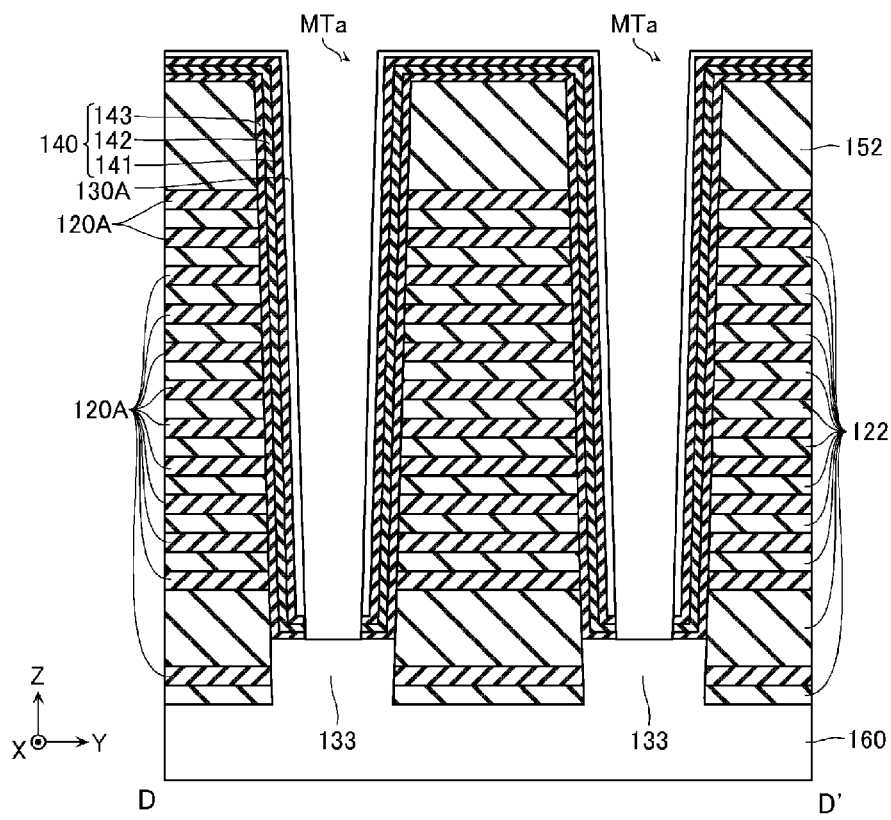

Next, as illustrated in FIGS. 9A and 9B, the portions of the block insulating layer 143, the charge storage layer 142, the insulating layer 141, and the amorphous silicon film 130A that are provided on the bottom surface of the opening MTa are removed, to expose the semiconductor layer 133. This step is performed by, for example, RIE or the like.

Figure 10A:
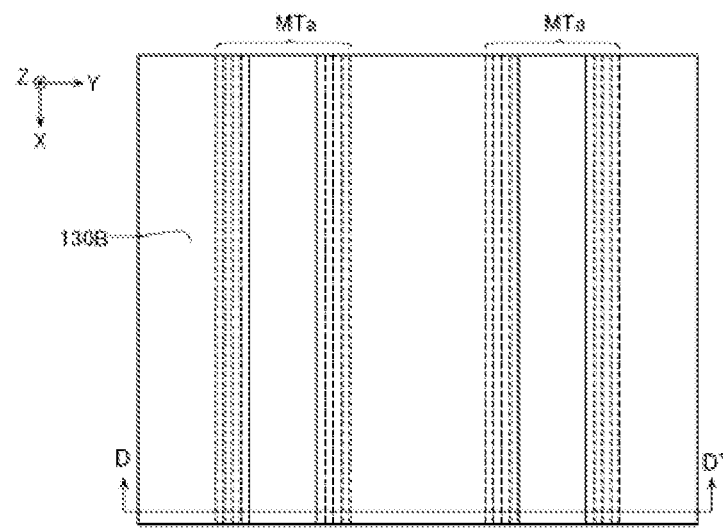
FIGS. 10A and 10B are a schematic plan view and a schematic cross-sectional view illustrating the same manufacturing method.
Figure 10B:
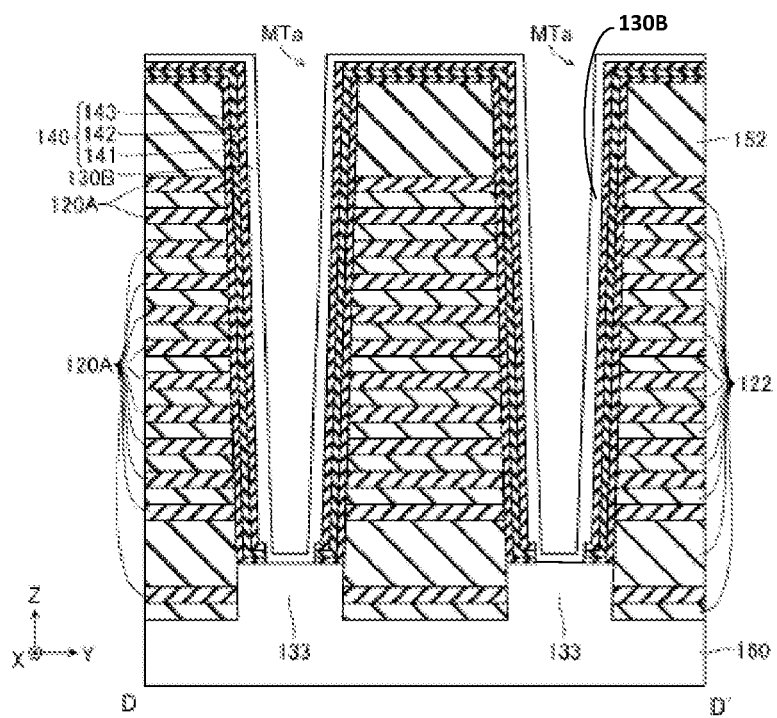

Next, as illustrated in FIGS. 10A and 10B, an amorphous silicon film is formed on the upper surface of the semiconductor layer 133 and the side surfaces and the upper surface of the amorphous silicon film 130A. This step is performed by, for example, a method such as CVD or the like. Next, a thermal processing or the like is performed to modify the crystal structure of the amorphous silicon film 130A, and form a semiconductor layer 130B such as polycrystalline silicon (poly-Si) or the like.

Figure 11A:
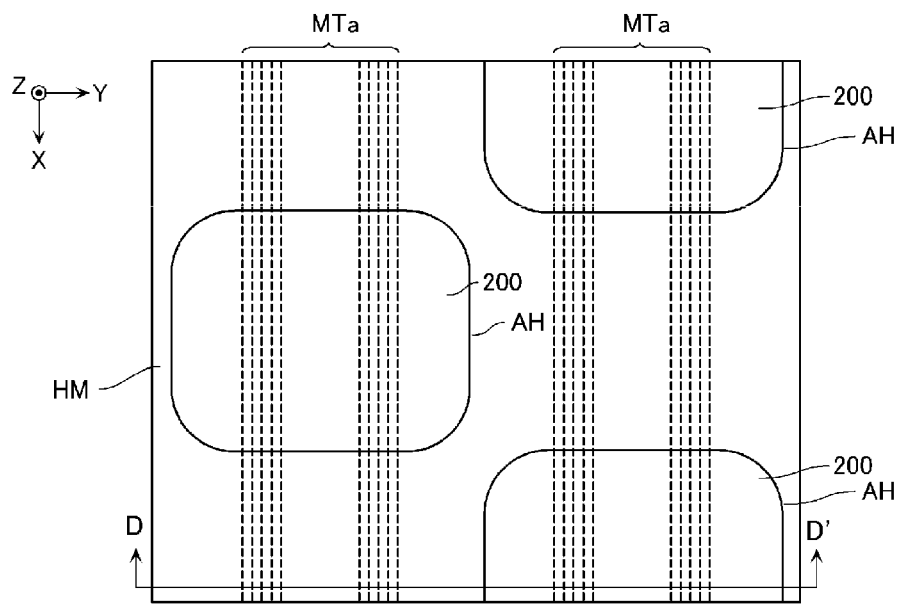
FIGS. 11A and 11B are a schematic plan view and a schematic cross-sectional view illustrating the same manufacturing method.
Figure 11B:
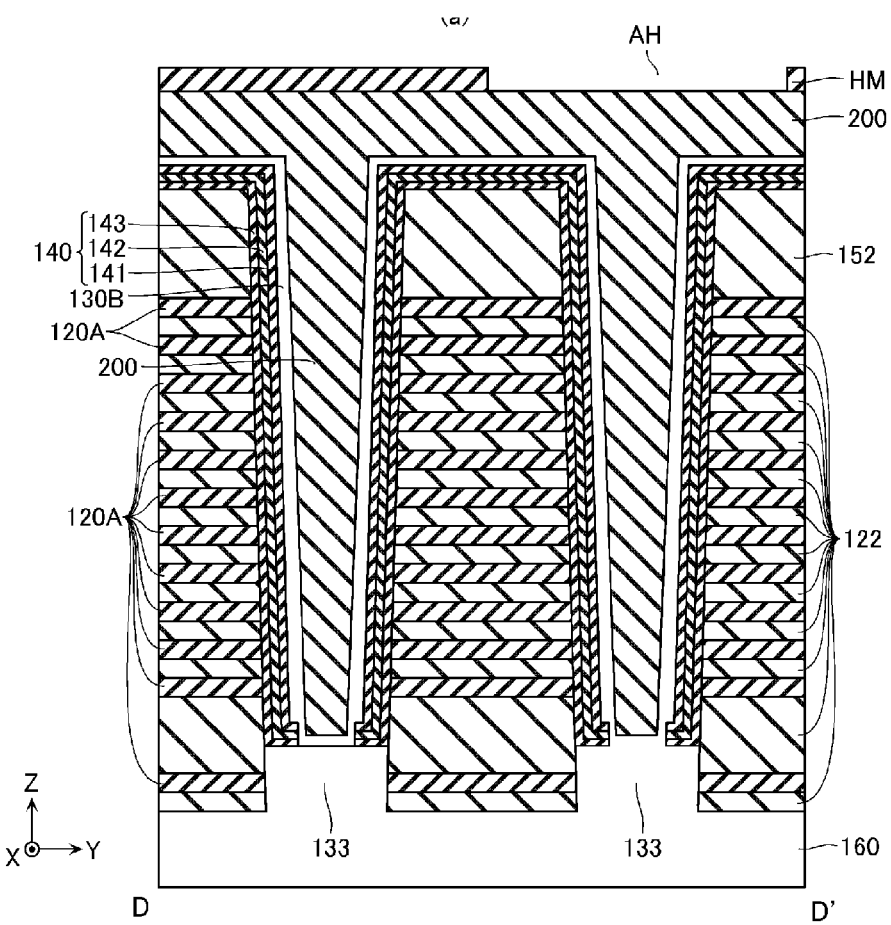

Next, as illustrated in FIGS. 11A and 11B, a carbon film 200 is formed inside the opening MTa. Then, a hard mask HM such as an oxide film or the like is formed on the upper surface of the carbon film 200, and an opening AH is formed in the hard mask HM. The carbon film 200 is formed by, for example, a spin coating of a coating type carbon film material, or the like. The hard mask HM is formed by, for example, CVD or the like. The opening AH is formed by, for example, a method such as photolithography, wet etching or the like.

Figure 12A:
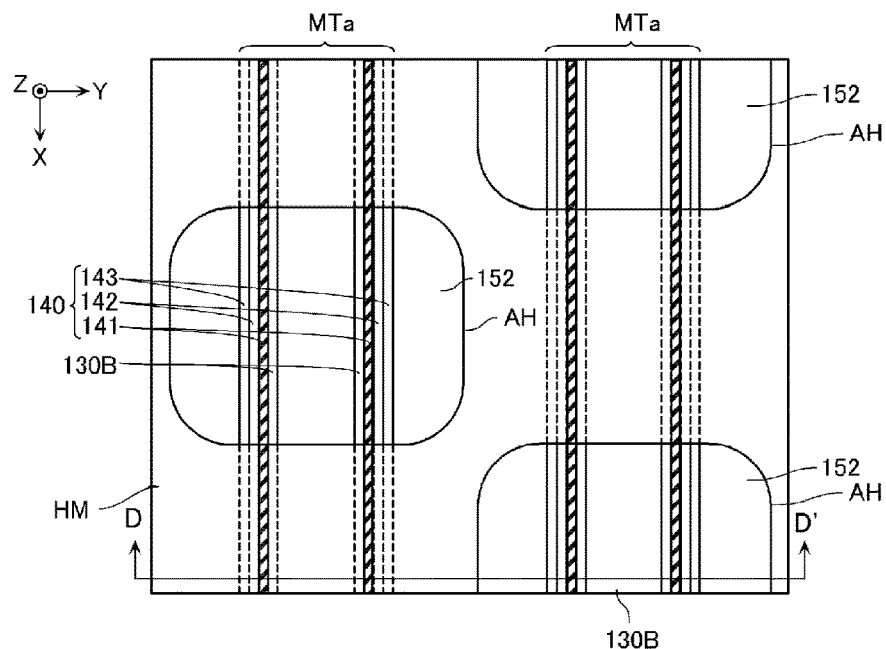
FIGS. 12A and 12B are a schematic plan view and a schematic cross-sectional view illustrating the same manufacturing method.
Figure 12B:
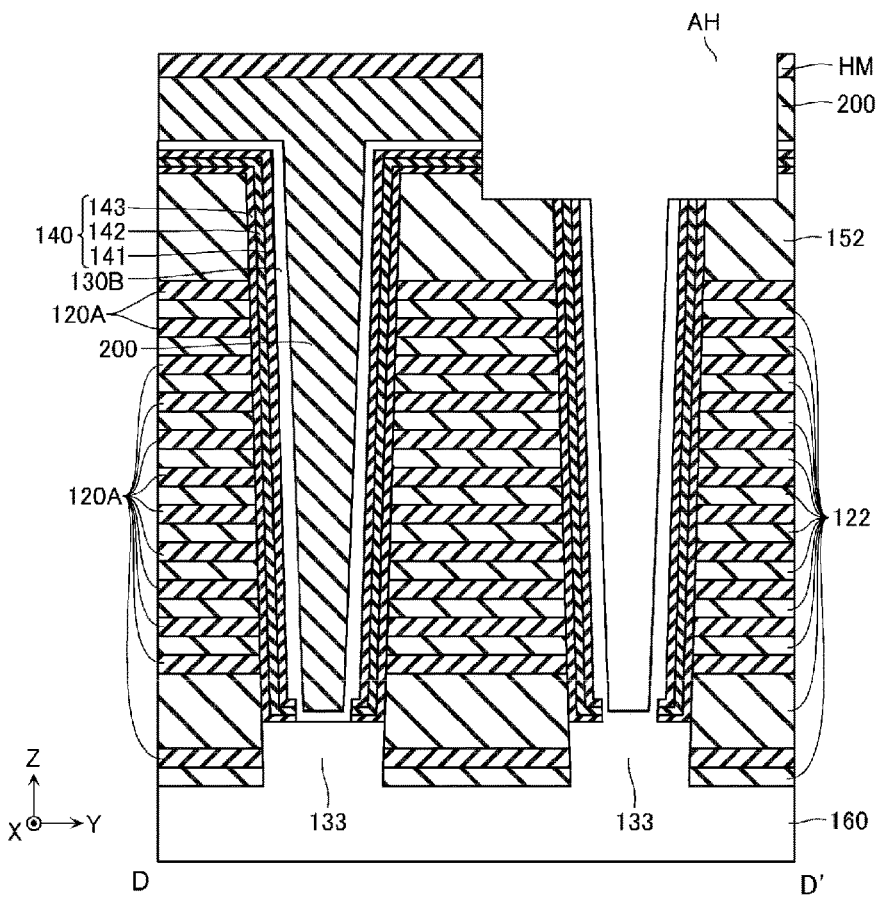

Next, as illustrated in FIGS. 12A and 12B, the portion of the carbon film 200 that is provided at the position which corresponds to the opening AH is removed. This step is performed by, for example, RIE or the like. Meanwhile, in this step, a portion of the semiconductor layer 130B, a portion of the insulating layer 141, a portion of the charge storage layer 142, and a portion of the block insulating layer 143 are also removed, and a portion of the insulating layer 152 is exposed.

Figure 13A:
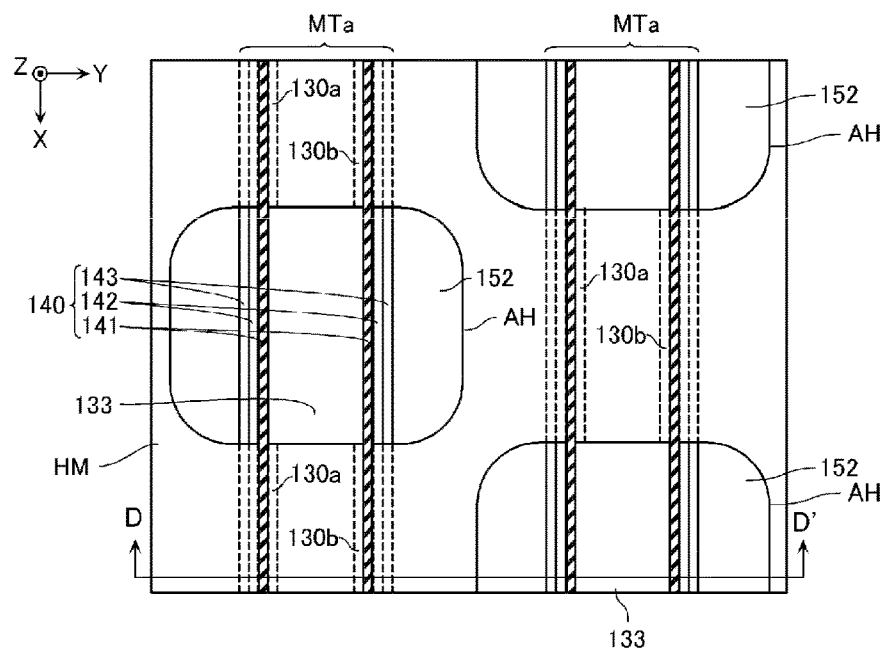
FIGS. 13A and 13B are a schematic plan view and a schematic cross-sectional view illustrating the same manufacturing method.
Figure 13B:
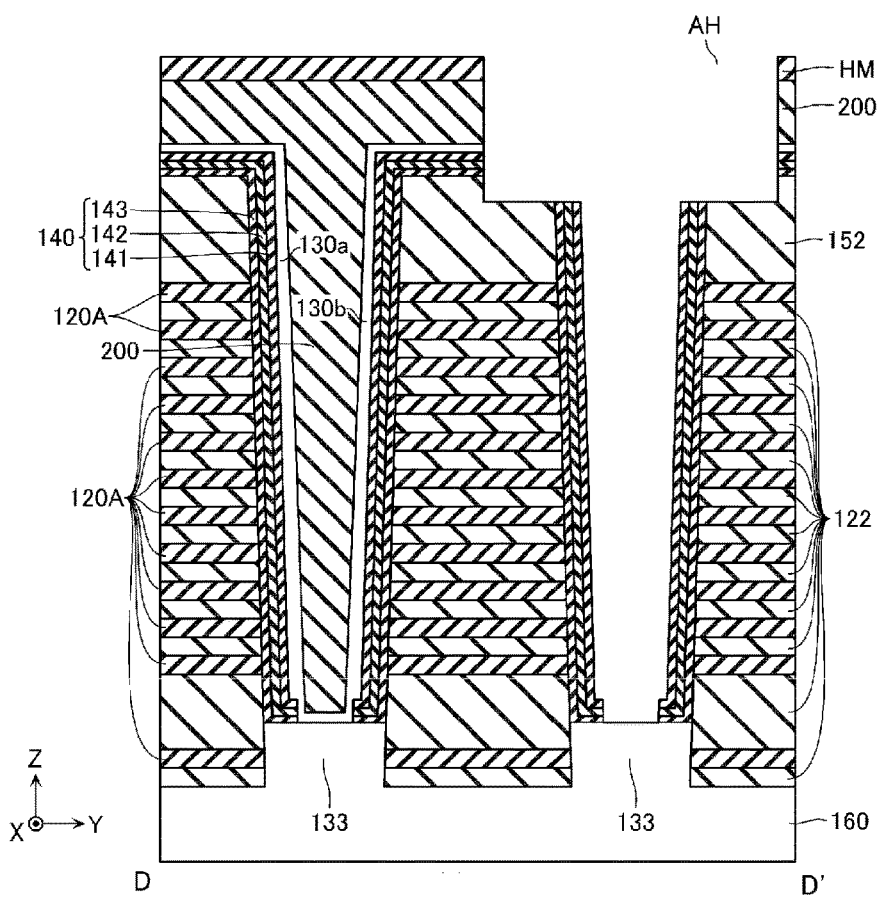

Next, as illustrated in FIGS. 13A and 13B, the portion of the semiconductor layer 130B that is exposed to the opening AH is removed. This step is performed by, for example, an isotropic etching with RIE, or the like. As a result of this step, the portion of the semiconductor layer 130B that is provided inside the opening MTa is divided in the X direction, so that the first semiconductor layer 130*a* and the second semiconductor layer 130*b* are formed side by side in the X direction.

Figure 14A:
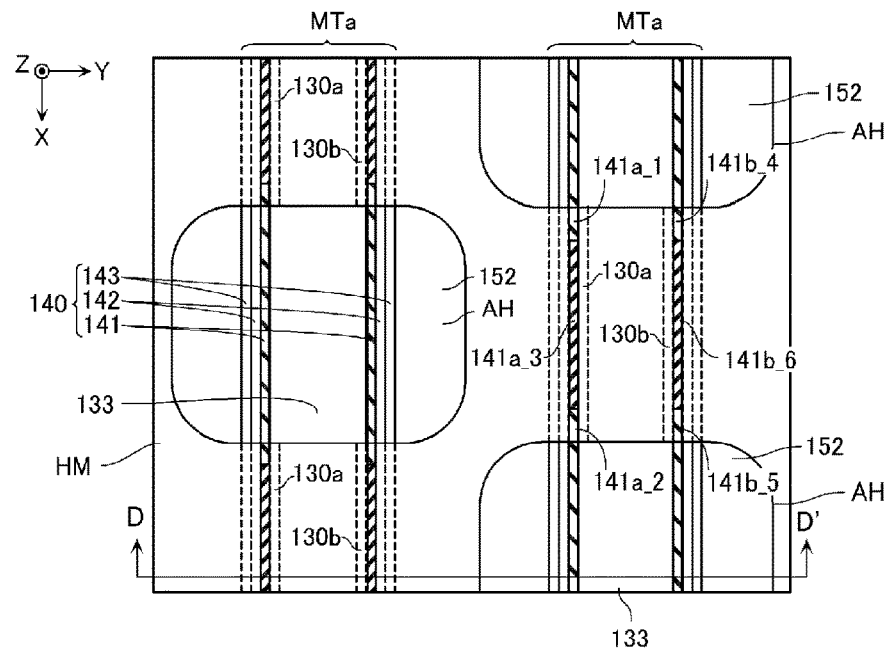
FIGS. 14A and 14B are a schematic plan view and a schematic cross-sectional view illustrating the same manufacturing method.
Figure 14B:
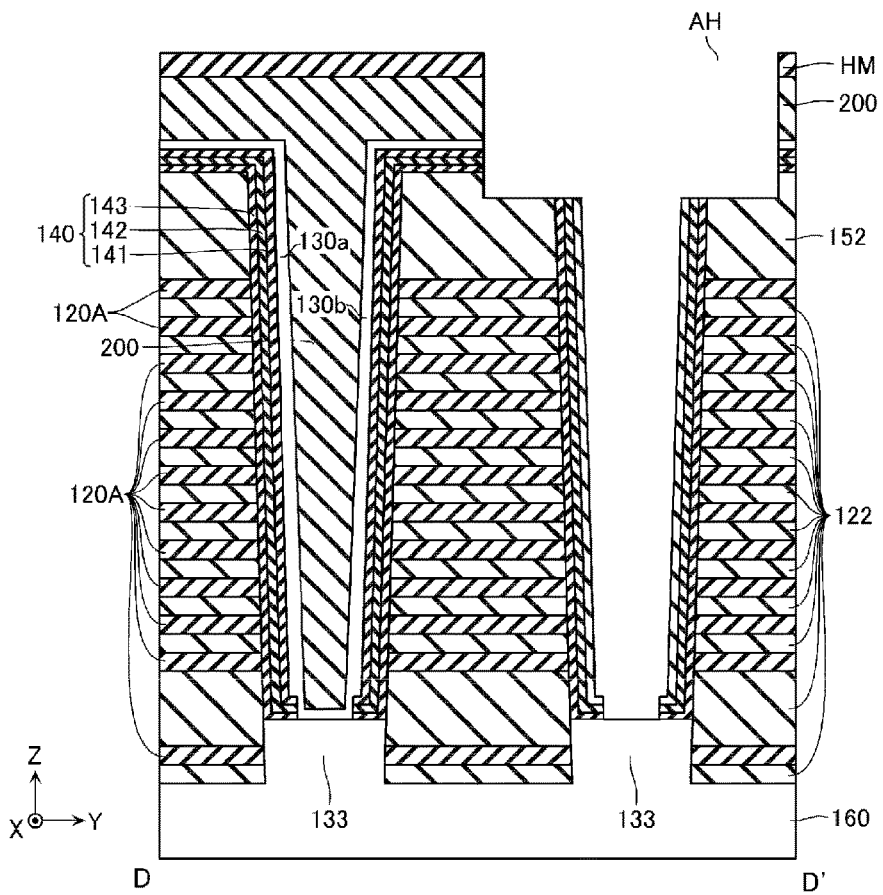

Next, as illustrated in FIGS. 14A and 14B, the exposed portion of the insulating layer 141 that is exposed to the opening AH and the unexposed portion of the insulating layer 141 that is not exposed to the opening AH are oxidized. This step is performed by, for example, introducing an oxidizer through the opening AH, and performing an oxidation process or the like. Meanwhile, the oxidation starts from the exposed portion of the insulating layer 141 that is exposed to the opening AH, and progresses toward the unexposed portion of the insulating layer 141 that is not exposed to the opening AH. The region where the oxidation progresses during this step corresponds to the low nitrogen concentration region (e.g., the first region 141*a*_1, the second region 141*a*_2, the fourth region 141*b*_4, and the fifth region 141*b*_5 described with reference to FIG. 4). Further, the region where the oxidation does not progress during this step corresponds to the high nitrogen concentration region (e.g., the third region 141*a*_3 and the sixth region 141*b*_6 described with reference to FIG. 4).

Figure 15A:
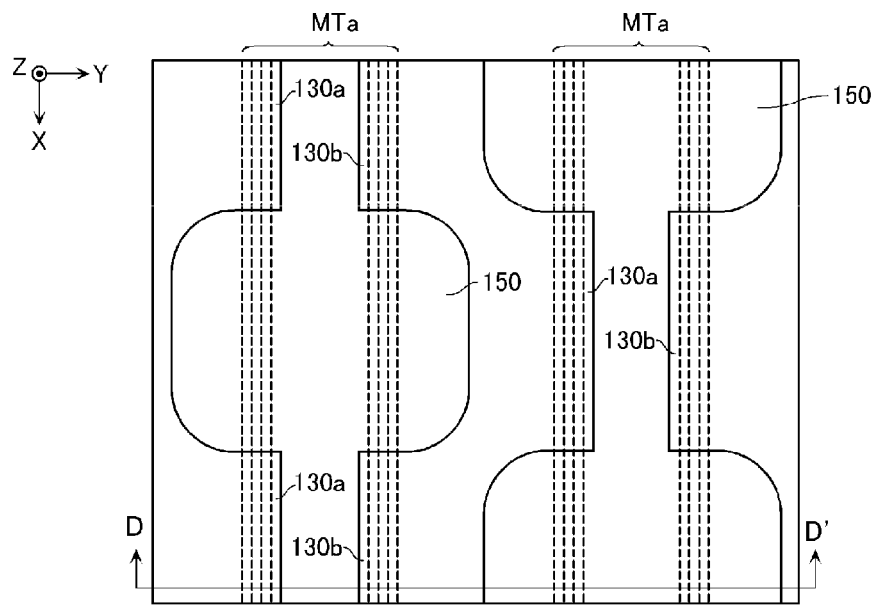
FIGS. 15A and 15B are a schematic plan view and a schematic cross-sectional view illustrating the same manufacturing method.
Figure 15B:
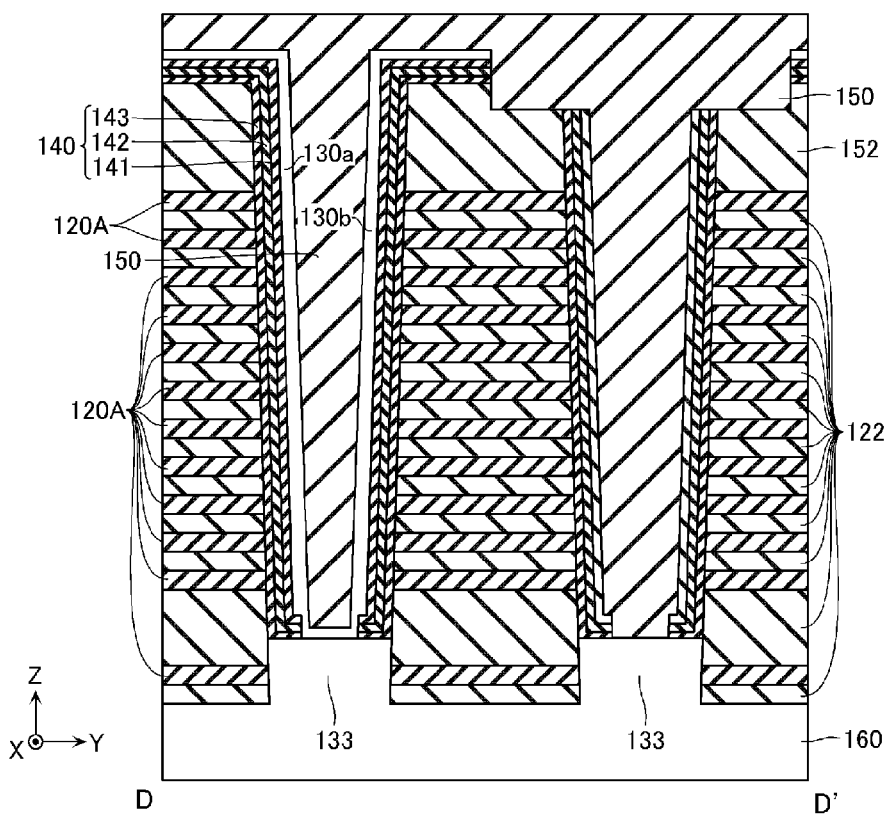

Next, as illustrated in FIGS. 15A and 15B, the hard mask HM and the carbon film 200 are removed, and the insulating layer 150 is formed inside the opening MTa to fill the opening. The hard mask HM is removed by, for example, wet etching or the like. The carbon film 200 is removed by, for example, asking or the like. The insulating layer 150 is formed by, for example, CVD or the like.

Figure 16A:
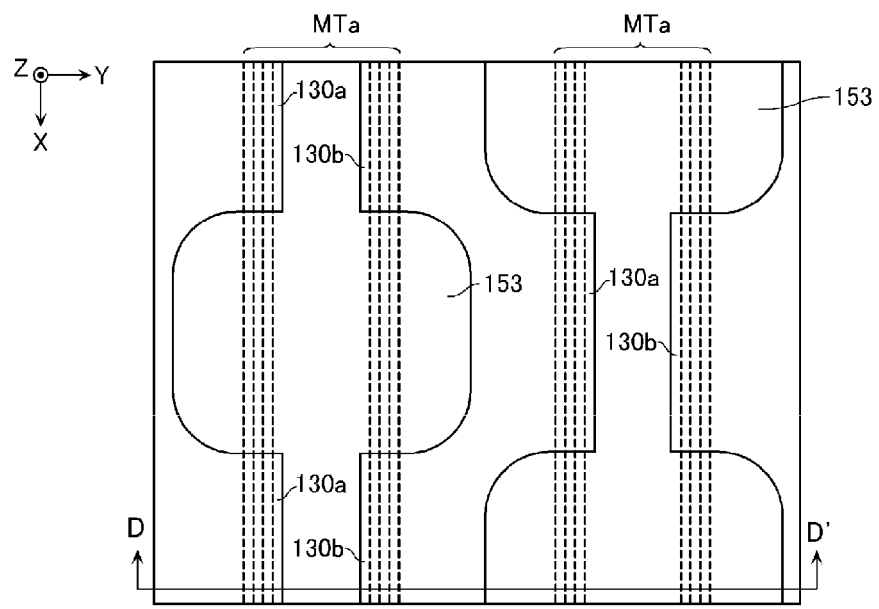
FIGS. 16A and 16B area schematic plan view and a schematic cross-sectional view illustrating the same manufacturing method.
Figure 16B:
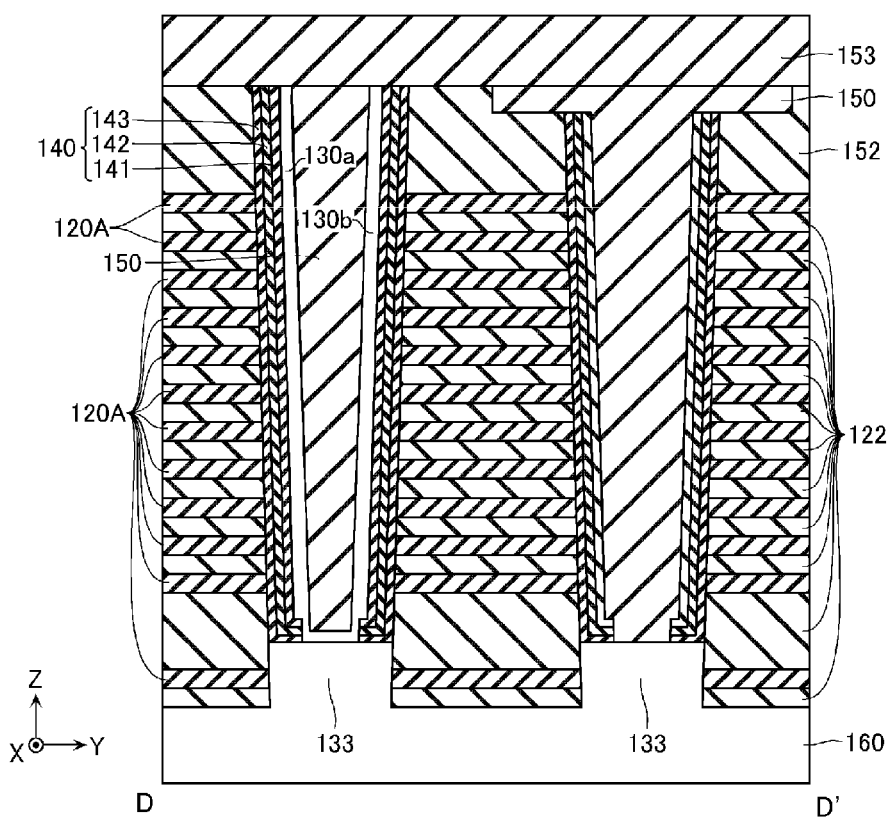

Next, as illustrated in FIGS. 16A and 16B, portions of the insulating layer 150, the first semiconductor layer 130*a*, the second semiconductor layer 130*b*, the insulating layer 141, the charge storage layer 142, and the block insulating layer 143 are removed from the upper surface of the structure illustrated in FIGS. 15A and 15B, and then, an insulating layer 153 is formed on the upper surface of the structure. The removing step is performed by, for example, RIE or the like. The insulating layer 153 is formed by, for example, CVD or the like.

Figure 17A:
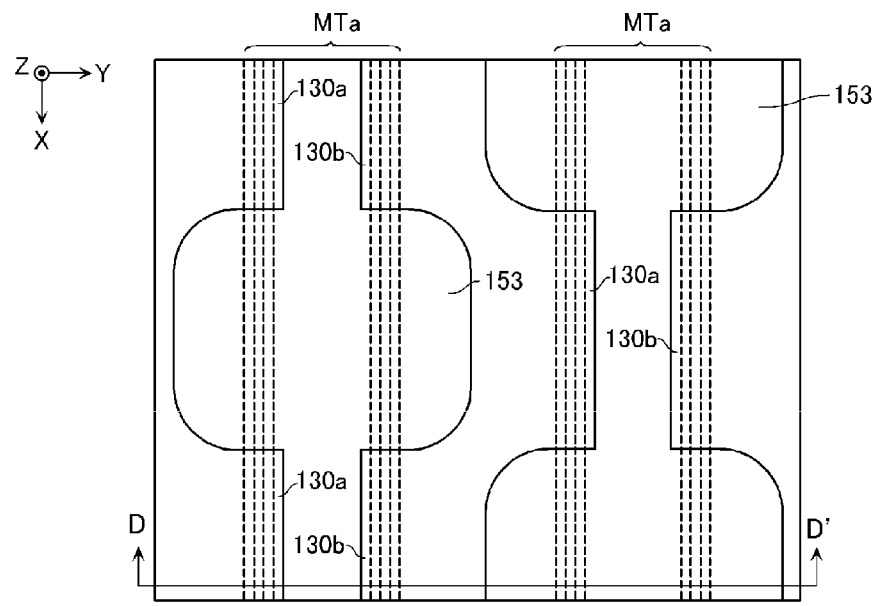
FIGS. 17A and 17B are a schematic plan view and a schematic cross-sectional view illustrating the same manufacturing method.
Figure 17B:
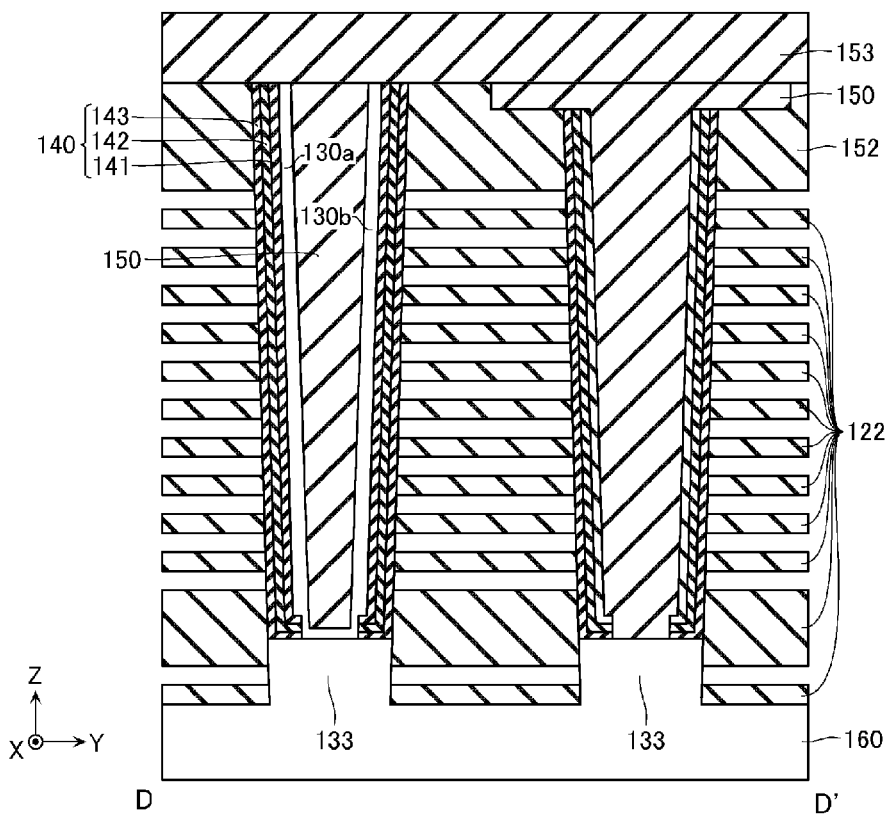

Next, as illustrated in FIGS. 17A and 17B, the multiple sacrificial layers 120A are removed through an opening (not illustrated). This step is performed by, for example, wet etching or the like.

Figure 18A:
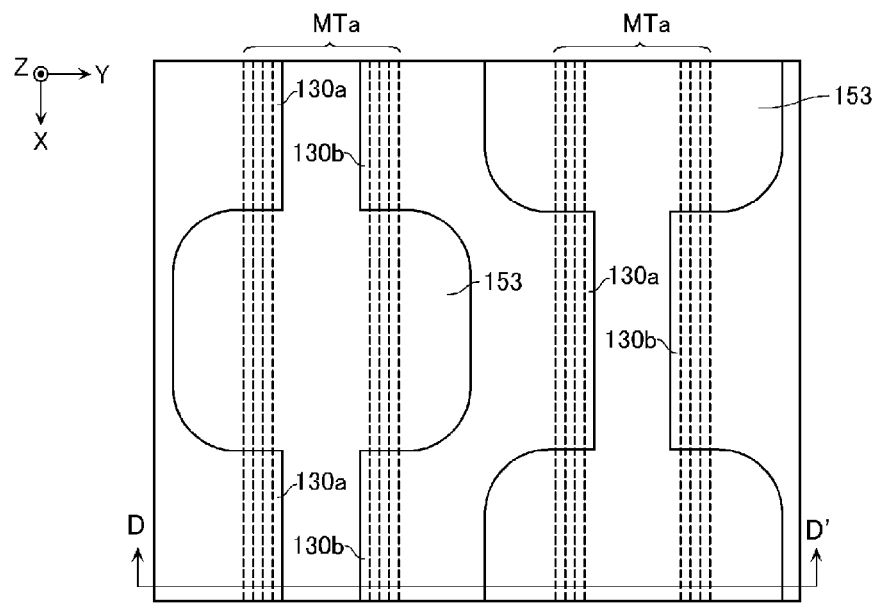
FIGS. 18A and 18B are a schematic plan view and a schematic cross-sectional view illustrating the same manufacturing method.
Figure 18B:
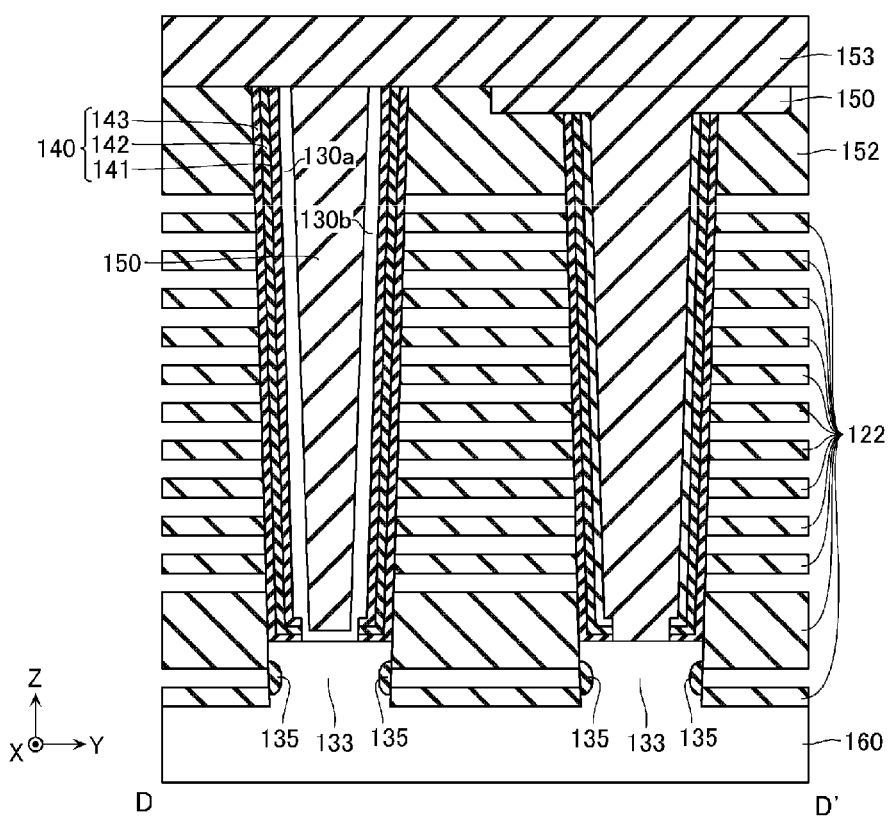

Next, as illustrated in FIGS. 18A and 18B, the insulating layer 135 is formed on the side surfaces of the semiconductor layer 133 through an opening (not illustrated). This step is performed by, for example, an oxidation process or the like.

Figure 19A:
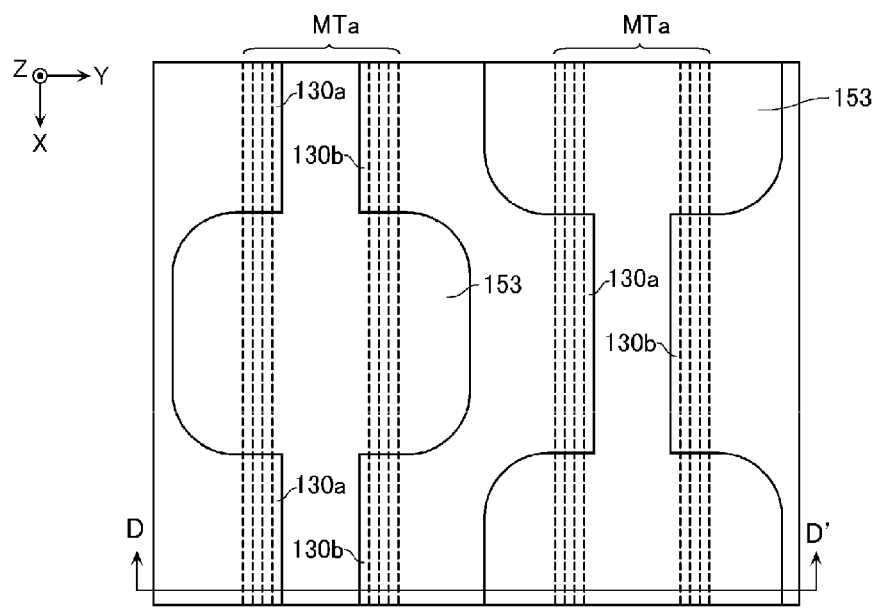
FIGS. 19A and 19B are a schematic plan view and a schematic cross-sectional view illustrating the same manufacturing method.
Figure 19B:
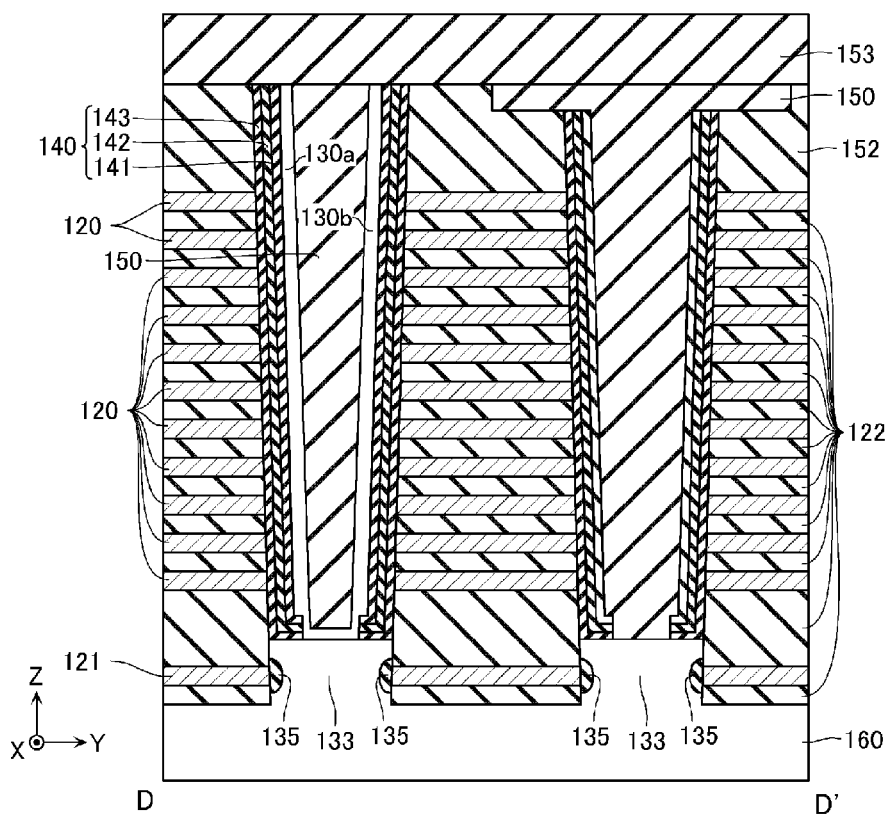

Next, as illustrated in FIGS. 19A and 19B, the conductive layers 120 and the conductive layer 121 are formed among the insulating layers 122 arranged in the Z direction via an opening (not illustrated). This step is performed by, for example, CVD, wet etching or the like.

Then, the upper ends of the first semiconductor layer 130*a* and the second semiconductor layer 130*b* are removed, and a fourth semiconductor layer 130*d* is formed at the removed portions. Then, the bit line contact BLC such as tungsten (W) or the like and the bit line BL such as cupper (Cu) or the like are formed. As a result, the structure described with reference to FIG. 2 is formed.

[Effects]

Figure 20:
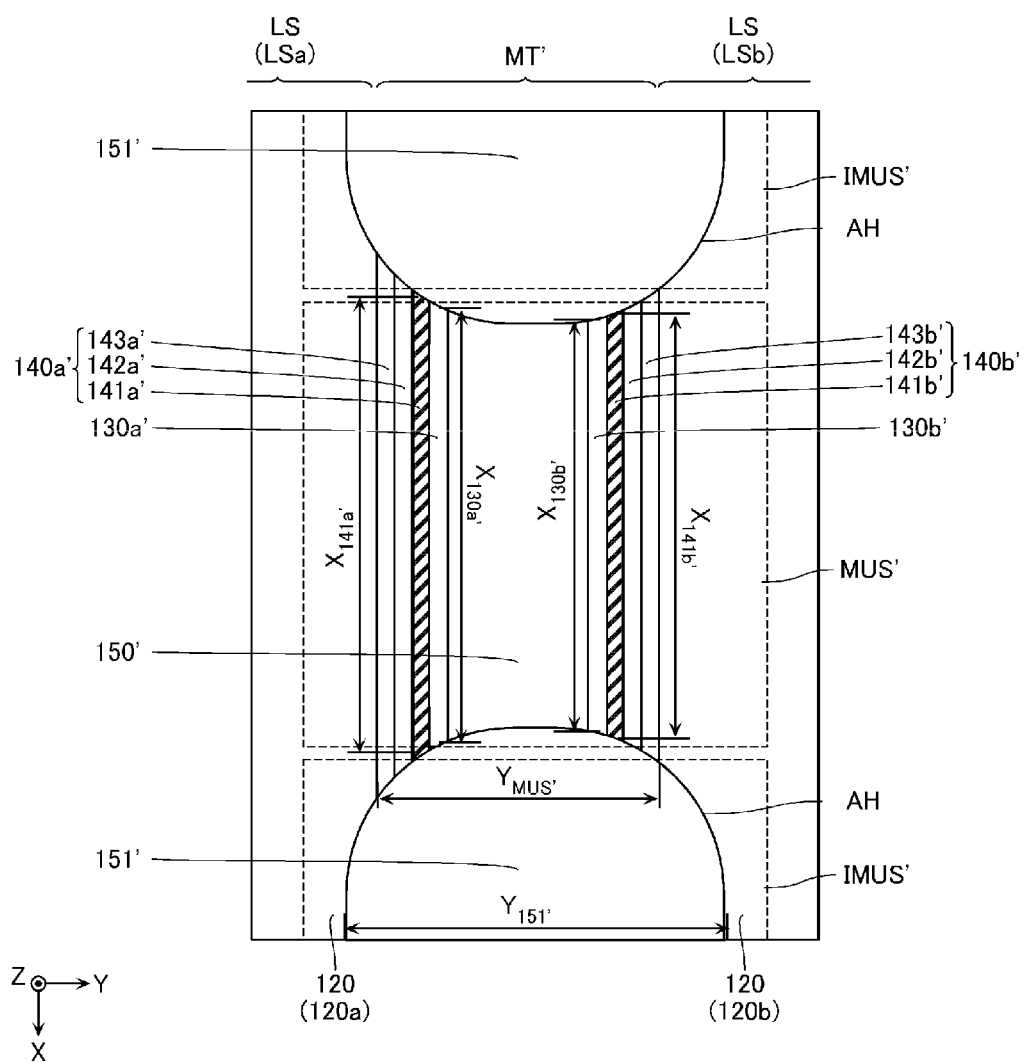
FIG. 20 is a schematic plan view illustrating a configuration of a portion of a semiconductor storage device according to a comparative example.

FIG. 20 illustrates a configuration of a semiconductor storage device according to a comparative example. The semiconductor storage device according to the comparative example includes a memory trench structure MT', instead of the memory trench structure MT. The memory trench structure MT' includes multiple memory unit structures MUS' and multiple inter-memory-unit structures IMUS' that are arranged in the X direction. Each memory unit structure MUS' includes a first semiconductor layer 130*a*', a second semiconductor layer 130*b*', a gate insulating layer 140', and an insulating layer 150', instead of the first semiconductor layer 130*a*, the second semiconductor layer 130*b*, a portion of the gate insulating layer 140, and a portion of the insulating layer 150. Each inter-memory-unit structure IMUS' includes an insulating layer 151', instead of a portion of the gate insulating layer 140 and a portion of the insulating layer 150.

The gate insulating layer 140' includes a first gate insulating layer 140*a*' and a second gate insulating layer 140*b*'.

Here, the first gate insulating layer 140*a* according to the first embodiment extends in the X direction over the multiple regions among the multiple first semiconductor layers 130*a* and the first conductive layer 120*a*. Meanwhile, the first gate insulating layer 140*a*' according to the comparative example is provided in each of multiple regions among the multiple first semiconductor layers 130*a*' and the first conductive layer 120*a*', and are separated from each other via an inter-memory-unit structure IMUS'.

Further, the second gate insulating layer 140*b* according to the first embodiment extends in the X direction over the multiple regions among the multiple second semiconductor layers 130*b* and the second conductive layer 120*b*. Meanwhile, the second gate insulating layer 140*b*' according to the comparative example is provided in each of the multiple regions among the multiple second semiconductor layers 130b' and the second conductive layer 120b, and are separated from each other via an inter-memory-unit structure IMUS'.

Further, the first gate insulating layer 140a' and the second gate insulating layer 140b' include a first insulating layer 141a' and a second insulating layer 141b', respectively, instead of the first insulating layer 141a and the second insulating layer 141b. The width X141a' of the first insulating layer 141a' in the X direction is substantially the same as the width X130a' of the first semiconductor layer 130a' in the X direction. The width X141b' of the second insulating layer 141b' in the X direction is substantially the same as the width X130b' of the second semiconductor layer 130b' in the X direction.

The insulating layers 150' are provided in the multiple memory unit structures MUS' arranged in the X direction, respectively, and are separated from each other via an inter-memory-unit structure IMUS'.

The insulating layers 151' are provided in the multiple inter-memory-unit structures IMUS' arranged in the X direction, respectively, and are separated from each other via a memory unit structure MUS'. Further, the width Y151' of the insulating layer 151' in the Y direction is larger than the width YMUS' of the memory unit structure MUS' in the Y direction.

When the semiconductor storage device according to the comparative example is manufactured, for example, the insulating layer 150' is formed inside the opening MTa after the step described with reference to FIGS. 10A and 10B is performed. Further, on the upper surface of the formed structure, the hard mask HM with the opening AH formed therein (FIGS. 11A and 11B) is formed. Further, a through hole is formed at the portion that corresponds to the opening AH, through RIE using the hard mask HM or the like, to divide the semiconductor layer 130B, the insulating layer 141, the charge storage layer 142, the block insulating layer 143, and the insulating layer 150' inside the opening MTa, in the X direction. Further, an insulating layer 151' is formed inside the through hole.

According to this structure, two memory strings MS that are electrically independent from each other may be formed in the memory trench structure MT, and a semiconductor storage device having a relatively large storage capacity may be provided.

However, when the structure described above is manufactured, a misalignment may occur in the Y direction during the patterning of the opening AH. As illustrated in FIG. 20, when a misalignment occurs in the Y direction, for example, the width X130b' of the second semiconductor layer 130b' in the X direction becomes shorter than the width X130a' of the first semiconductor layer 130a' in the X direction, and the characteristics of the two memory strings MS formed on both side surfaces of the memory trench structure MT become different from each other, which causes the lack of uniformity in memory characteristics.

Further, in consideration of the misalignment margin of the opening AH in the Y direction with respect to the memory trench structure MT, the separation distance between adjacent memory trench structures MT may not be designed to be short. Accordingly, in the structure of the comparative example, it is difficult to miniaturize and highly integrate the memory structure.

Thus, when the semiconductor storage device according to the first embodiment is manufactured, only the semiconductor layer 130 is selectively divided, without dividing the gate insulating layer 140 in the X direction, in the step described with reference to FIGS. 13A and 13B. In this structure, it is unnecessary to consider the misalignment margin in the Y direction with respect to the memory trench structure MT, so that the separation distance between adjacent memory trench structures MT in the Y direction may be designed to be small, and the size of memory cells may be reduced.

Further, in the structure in which the first semiconductor layer 130a and the second semiconductor layer 130b are divided in the X direction as in at least one embodiment, when a gate voltage is applied to the first conductive layer 120a and the second conductive layer 120b, a high-strength electric field may concentrate on both ends of the first semiconductor layer 130a and the second semiconductor layer 130b in the X direction, and both the ends may become so-called parasitic transistors. That is, the threshold voltage of the parasitic transistors that correspond to both the ends in the X direction may become lower than the threshold voltage of the transistors that correspond to the other portion. In this case, the parasitic transistors that correspond to both the ends in the X direction are turned ON at the lower voltage than that for the transistors that correspond to the other portion, which causes a problem that the ON characteristic of the memory cells MC for the application of the gate voltage is divided into two stages.

Accordingly, in at least one embodiment, as illustrated in FIG. 4, the nitrogen concentration in the portions of the first insulating layer 141a and the second insulating layer 141b that face both ends of the first semiconductor layer 130a and the second semiconductor layer 130b in the X direction (the low nitrogen concentration regions including the first region 141a_1, the second region 141a_2, the fourth region 141b_4, and the fifth region 141b_5) is lower than that in the portions of the first insulating layer 141a and the second insulating layer 141b that face the other portion of the first semiconductor layer 130a and the second semiconductor layer 130b (the high nitrogen concentration regions including the third region 141a_3 and the sixth region 141b_6).

The electron injection efficiency in the low nitrogen concentration regions is smaller than the electron injection efficiency in the high nitrogen concentration regions. Thus, in the semiconductor storage device according to the first embodiment, it is possible to avoid that the high-strength electric field concentrates on both the ends of the first semiconductor layer 130a and the second semiconductor layer 130b in the X direction, and it is possible to prevent parasitic transistors from operating. As a result, it is possible to provide a semiconductor storage device which operates favorably, preventing the voltage characteristic of the memory cells MC from being divided into two stages.

Modification of First Embodiment

Figure 21:
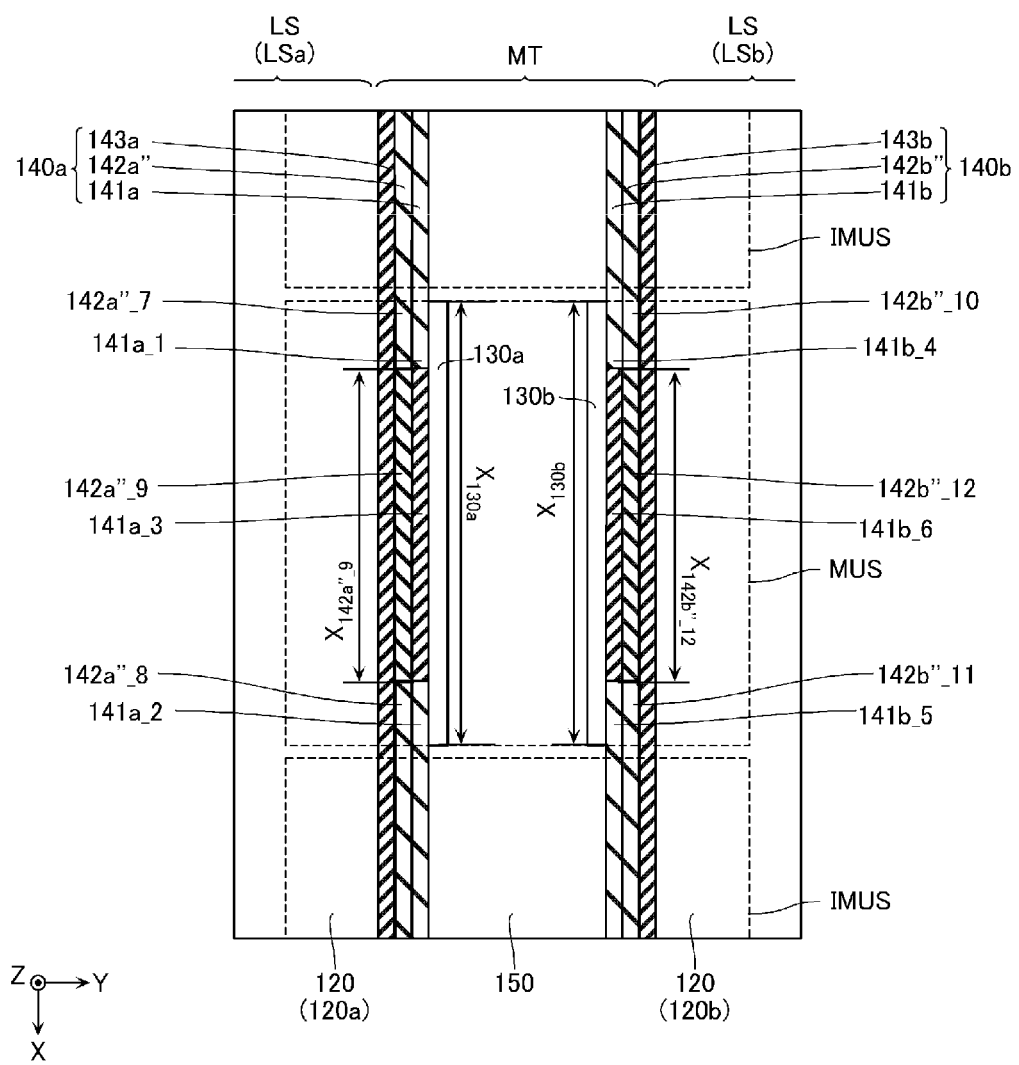
FIG. 21 is a schematic plan view of a configuration of a portion of a semiconductor storage device according to a modification according to at least one embodiment.

FIG. 21 illustrates a modification of the configuration of the first embodiment. FIG. 21 is a schematic plan view illustrating a portion of the configuration of the semiconductor storage device according to the present modification.

The memory unit structures MUS and the inter-memory-unit structures IMUS according to the present modification basically have the same configuration as those in the first embodiment. However, the semiconductor storage device according to the present modification includes a first charge storage layer 142a" and a second charge storage layer 142b", instead of the first charge storage layer 142a and the second charge storage layer 142b.

The first charge storage layer 142a" includes multiple high nitrogen concentration regions provided corresponding to the multiple memory unit structures MUS arranged in the X direction, and multiple low nitrogen concentration regions provided corresponding to the multiple inter-memory-unit structures IMUS arranged in the X direction. For example, FIG. 21 illustrates a seventh region 142a"_7 and an eighth region 142a"_8, as two low nitrogen concentration regions that correspond to two inter-memory-unit structures IMUS adjacent to each other in the X direction. Further, FIG. 21 illustrates a ninth region 142a"_9 as a high nitrogen concentration region provided between the two low nitrogen concentration regions. The width X142a"_9 of each high nitrogen concentration region in the X direction is smaller than the width X130a of the first semiconductor layer 130a in the X direction. Further, the ends of each low nitrogen concentration region in the X direction face the Y-directional side surfaces of the two first semiconductor layers 130a adjacent to each other in the X direction. For example, in the memory unit structure MUS illustrated in FIG. 21, the end of the seventh region 142a"_7 in the X direction faces the Y-directional side surface of one end of the first semiconductor layer 130a in the X direction. Further, the position of the eighth region 142a"_8 in the X direction faces the Y-directional side surface of the other end of the first semiconductor layer 130a in the X direction. The nitrogen concentration in each low nitrogen concentration region (e.g., the seventh region 142a"_7 and the eighth region 142a"_8) is lower than the nitrogen concentration in each high nitrogen concentration region (e.g., the ninth region 142a"_9).

The low nitrogen concentration region (e.g., the seventh region 142a"_7 and the eighth region 142a"_8) may contain silicon oxynitride (SiON) having a lower nitrogen content than that of the high nitrogen concentration region (e.g., the ninth region 142a"_9). Further, the low nitrogen concentration region (e.g., the seventh region 142a"_7 and the eighth region 142a"_8) may contain silicon oxide ($SiO_2$).

The second charge storage layer 142b" includes multiple high nitrogen concentration regions provided corresponding to the multiple memory unit structures MUS arranged in the X direction, and multiple low nitrogen concentration regions provided corresponding to the multiple inter-memory-unit structures IMUS arranged in the X direction. For example, FIG. 21 illustrates a tenth region 142b"_10 and an eleventh region 142b"_11, as two low nitrogen concentration regions that correspond to the inter-memory-unit structures IMUS adjacent to each other in the X direction. Further, FIG. 21 illustrates a twelfth region 142b"_12, as a high nitrogen concentration region provided between the two low nitrogen concentration regions. The width X142b"_12 of each high nitrogen concentration region in the X direction is smaller than the width X130b of the second semiconductor layer 130b in the X direction. Further, the ends of each low nitrogen concentration region in the X direction face the Y-directional side surfaces of the two second semiconductor layers 130b to each other in the X direction. For example, in the memory unit structure MUS illustrated in FIG. 21, the end of the tenth region 142b"_10 in the X direction faces the Y-directional side surface of one end of the second semiconductor layer 130b in the X direction. Further, the position of the eleventh region 142b"_11 in the X direction faces the Y-directional side surface of the other end of the second semiconductor layer 130b in the X direction. The nitrogen concentration in each low nitrogen concentration region (e.g., the tenth region 142b"_10 and the eleventh region 142b"_11) is lower than the nitrogen concentration in each high nitrogen concentration region (e.g., the twelfth region 142b"_12).

The low nitrogen concentration region (e.g., the tenth region 142b"_10 and the eleventh region 142b"_11) may contain silicon oxynitride (SiON) having a lower nitrogen content than that of the high nitrogen concentration region (e.g., the twelfth region 142b"_12). Further, the low nitrogen concentration region (e.g., the tenth region 142b"_10 and the eleventh region 142b"_11) may contain silicon oxide ($SiO_2$).

Other Embodiments

The semiconductor storage device according to the first embodiment has been described. However, the configuration that has been described is merely an example, and details of the configuration and others may be appropriately adjusted.

For example, according to the first embodiment and its modification, the low nitrogen concentration regions (the first region 141a_1, the second region 141a_2, the fourth region 141b_4, and the fifth region 141b_5) illustrated in FIGS. 4 and 21 are formed by the oxidation process through the opening AH in the step described with reference to FIGS. 14A and 14B. However, the timing for performing the oxidation process to form the low nitrogen concentration regions may be appropriately adjusted. For example, the step described with reference to FIGS. 14A and 14B may be omitted, and the oxidation process for forming the low nitrogen concentration regions may be performed in a step after the step illustrated in FIGS. 14A and 14B.

Further, for example, according to the first embodiment and its modification, the oxidation process through the opening AH is performed for forming the low nitrogen concentration regions (the first region 141a_1, the second region 141a_2, the fourth region 141b_4, and the fifth region 141b_5), in the step described with reference to FIGS. 14A and 14B. However, the low nitrogen concentration regions may be formed according to a method other than the oxidation process. For example, after the step described with reference to FIGS. 13A and 13B is performed, a portion of the insulating layer 141 may be removed by a method such as wet etching through the opening AH. Further, the positions that correspond to the low nitrogen concentration regions (the first region 141a_1, the second region 141a_2, the fourth region 141b_4, and the fifth region 141b_5) may be filled, by a method such as CVD or the like, with a material having a lower nitrogen concentration than that in the high nitrogen concentration regions (the third region 141a_3 and the sixth region 141b_6).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a first conductive layer and a second conductive layer arranged in a first direction;
   a plurality of first semiconductor layers facing the first conductive layer, the first semiconductor layers disposed between the first conductive layer and the second conductive layer, the plurality of first semiconductor layers being arranged in a second direction that intersects the first direction;

a first charge storage layer that is disposed between the plurality of first semiconductor layers and the first conductive layer in the first direction, and the first charge storage layer extending in the second direction over a plurality of regions between the plurality of first semiconductor layers and the first conductive layer; and a first insulating layer disposed between the plurality of first semiconductor layers and the first charge storage layer in the first direction, wherein the first insulating layer includes:

a first region that faces one end of each of the first semiconductor layers in the second direction, the first region extending in the first direction, a second region that faces the other end of each of the first semiconductor layers in the second direction, the second region extending in the first direction, and a third region disposed between the first region and the second region in the second direction; and the first region and the second region each have a lower nitrogen concentration than the third region, wherein an end of the first region in the first direction contacts an end of the first semiconductor layer in the first direction.

2. The semiconductor storage device according to claim 1, further comprising:

a substrate, wherein a plurality of first conductive layers are further arranged in a third direction that intersects the first direction and the second direction.

3. The semiconductor storage device according to claim 2, further comprising:

a substrate, wherein the first semiconductor layers are arranged in the third direction and face the plurality of first conductive layers in the first direction.

4. The semiconductor storage device according to claim 1, wherein the first insulating layer contains silicon oxynitride (SiON).

5. The semiconductor storage device according to claim 1, wherein the first charge storage layer contains silicon nitride (SiN).

6. The semiconductor storage device according to claim 1, further comprising:

a plurality of second semiconductor layers face the second conductive layer between the plurality of first semiconductor layers and the second conductive layer, the plurality of second semiconductor layers being arranged in the second direction;

a second charge storage layer that is disposed between the plurality of second semiconductor layers and the second conductive layer in the first direction, and the second charge storage layer extends over a plurality of regions between the plurality of second semiconductor layers and the second conductive layer; and a second insulating layer disposed between the plurality of second semiconductor layers and the second charge storage layer in the first direction, wherein the second insulating layer includes:

a fourth region that faces one end of each of the second semiconductor layers in the second direction, the fourth region extending in the first direction, a fifth region that faces the other end of each of the second semiconductor layers in the second direction, the fifth region extending in the first direction, and a sixth region disposed between the fourth region and the fifth region in the second direction; and the fourth region and the fifth region each having a lower nitrogen concentration than the sixth region.

7. The semiconductor storage device according to claim 6, further comprising:

a substrate, wherein a plurality of second conductive layers are further arranged in a third direction that intersects the first direction and the second direction.

8. The semiconductor storage device according to claim 7, further comprising:

a substrate, wherein the second semiconductor layers are arranged in the third direction and face the plurality of second conductive layers in the first direction.

9. The semiconductor storage device according to claim 6, wherein the second insulating layer contains silicon oxynitride (SiON).

10. The semiconductor storage device according to claim 6, wherein the second charge storage layer contains silicon nitride (SiN).

11. The semiconductor storage device according to claim 9, wherein the second charge storage layer contains silicon nitride (SiN).

12. The semiconductor storage device according to claim 1, wherein the conductive layers include word lines or gate electrodes.

13. The semiconductor storage device according to claim 1, wherein the first and second regions contain silicon oxide ($SiO_2$).

14. The semiconductor storage device according to claim 4, wherein the first and second regions contain silicon oxide ($SiO_2$).

15. A semiconductor storage device, comprising:

a first conductive layer and a second conductive layer arranged in a first direction;

a plurality of first semiconductor layers facing the first conductive layer, the first semiconductor layers disposed between the first conductive layer and the second conductive layer, the plurality of first semiconductor layers being arranged in a second direction that intersects the first direction;

a first charge storage layer that is disposed between the plurality of first semiconductor layers and the first conductive layer in the first direction, and the first charge storage layer extending in the second direction over a plurality of regions between the plurality of first semiconductor layers and the first conductive layer; and a first insulating layer disposed between the plurality of first semiconductor layers and the first charge storage layer in the first direction, wherein the first insulating layer includes:

a first region that faces one end of each of the first semiconductor layers in the second direction, the first region extending in the first direction, a second region that faces the other end of each of the first semiconductor layers in the second direction, the second region extending in the first direction, and a third region disposed between the first region and the second region in the second direction; and the first region and the second region each have a lower nitrogen concentration than the third region, wherein the third region has a smaller width than the first semiconductor layer in the first direction.

* * * * *